US012205656B2

(12) United States Patent
Kim et al.

(10) Patent No.: US 12,205,656 B2
(45) Date of Patent: Jan. 21, 2025

(54) MEMORY DEVICE AND METHOD FOR DETERMINING START POINT AND END POINT OF VERIFICATION OPERATION OF TARGET STATE DURING PROGRAMMING

(71) Applicant: Samsung Electronics Co., Ltd., Suwon-si (KR)

(72) Inventors: Dobin Kim, Suwon-si (KR); Wontaeck Jung, Hwaseong-si (KR); Jaehyuk Yang, Changwon-si (KR); Jinwoo Yang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 189 days.

(21) Appl. No.: 17/881,009

(22) Filed: Aug. 4, 2022

(65) Prior Publication Data

US 2023/0112849 A1    Apr. 13, 2023

(30) Foreign Application Priority Data

Oct. 8, 2021  (KR) .......................... 10-2021-0134461

(51) Int. Cl.
| | | |
|---|---|---|
| *G11C 16/34* | (2006.01) | |
| *G11C 11/56* | (2006.01) | |
| *G11C 16/10* | (2006.01) | |
| *H01L 23/00* | (2006.01) | |

(Continued)

(52) U.S. Cl.
CPC ...... *G11C 16/3459* (2013.01); *G11C 11/5628* (2013.01); *G11C 11/5671* (2013.01); *G11C 16/10* (2013.01); *H01L 24/08* (2013.01); *H01L 25/0657* (2013.01); *H01L 25/18* (2013.01);

(Continued)

(58) Field of Classification Search
CPC ............ G11C 16/3459; G11C 11/5628; G11C 11/5671; G11C 16/10; G11C 16/0483; G11C 8/14; G11C 16/3404; H01L 24/08; H01L 25/0657; H01L 25/18; H01L 2224/08145; H01L 2924/1431; H01L 2924/14511; H01L 2225/06527; H01L 2225/06541; H01L 2225/06565
See application file for complete search history.

(56) References Cited

U.S. PATENT DOCUMENTS

| | | |
|---|---|---|
| 7,584,391 B2 | 9/2009 | Gongwer et al. |
| 7,679,133 B2 | 3/2010 | Son et al. |
| 7,983,079 B2 | 7/2011 | Kim |

(Continued)

FOREIGN PATENT DOCUMENTS

KR    10-2010-0056860 A    5/2010

*Primary Examiner* — Jerome Leboeuf
(74) *Attorney, Agent, or Firm* — Harness, Dickey & Pierce, P.L.C.

(57) ABSTRACT

A memory device and a method for programming the same may include, applying program loops to a plurality of memory cells of the memory device to adjust threshold voltages of the plurality of memory cells to desired target states, each of the program loops including a program section and a verification section, programming the memory cells of a first page, storing a number of first program loops used to complete the programming of the memory cells of the first page to a first target state, programming the memory cells of a second page to the first target state, the second page adjacent to the first page, and performing a verification operation on the second page.

17 Claims, 13 Drawing Sheets

(51) Int. Cl.
*H01L 25/065* (2023.01)
*H01L 25/18* (2023.01)

(52) U.S. Cl.
CPC .............. *H01L 2224/08145* (2013.01); *H01L 2924/1431* (2013.01); *H01L 2924/14511* (2013.01)

(56) References Cited

U.S. PATENT DOCUMENTS

| | | |
|---|---|---|
| 8,081,519 B2 | 12/2011 | Lee et al. |
| 8,228,741 B2 | 7/2012 | Li et al. |
| 8,539,138 B2 | 9/2013 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,406,394 B2 | 8/2016 | Yoon et al. |
| 9,779,833 B2 | 10/2017 | Joo et al. |
| 9,792,999 B2 | 10/2017 | Lee et al. |
| 2009/0040836 A1* | 2/2009 | Lee .................... G11C 16/0483 365/185.12 |
| 2011/0233648 A1 | 9/2011 | Seol et al. |
| 2014/0376312 A1* | 12/2014 | Song ..................... G11C 16/10 365/185.12 |
| 2021/0158873 A1* | 5/2021 | Lee .................... G11C 16/0483 |
| 2022/0351791 A1* | 11/2022 | Kim ....................... G11C 16/24 |

\* cited by examiner

FIG. 10

|    | PASS LOOP OF PREVIOUS PAGE | VERIFY OFFSET | VERIFY LOOP NUMBER |
|----|---|---|---|
| P1 | 10 | – | – |
| P2 | 12 | 7 | 6,7,8,9,10,11,12 |
| P3 | 13 | 7 | 7,8,9,10,11,12,13 |
| P4 | 15 | 7 | 9,10,11,12,13,14,15 |
| P5 | 16 | 6 | 11,12,13,14,15,16 |
| P6 | 18 | 6 | 13,14,15,16,17,18 |
| P7 | 20 | 6 | 15,16,17,18,19,20 |

MEMORY DEVICE AND METHOD FOR DETERMINING START POINT AND END POINT OF VERIFICATION OPERATION OF TARGET STATE DURING PROGRAMMING

CROSS-REFERENCE TO RELATED APPLICATION

This U.S. non-provisional application is based on and claims the benefit of priority under 35 U.S.C. § 119 to Korean Patent Application No. 10-2021-0134461, filed on Oct. 8, 2021, in the Korean Intellectual Property Office, the disclosure of which is incorporated by reference herein in its entirety.

BACKGROUND

Various example embodiments of the inventive concepts relate to semiconductor memory devices, and more particularly, to a memory device capable of determining a start point and an end point of a verification operation related to a target state during programming, a system including the memory device, and/or a programming method of the memory device.

To store data and/or instructions used by a host (e.g., host device, etc.) in a system and/or to perform computational operations, the system includes semiconductor chips and uses a dynamic random access memory (DRAM) as an operating memory or main memory of the system and a storage device as a storage medium. The storage device includes a non-volatile memory. As the storage capacity of the storage device increases, the number of memory cells and word lines stacked on a substrate of the non-volatile memory increases, and the number of bits of data stored in the memory cell increases. To improve the storage capacity and integration of the memory, a non-volatile memory device in which memory cells are stacked in a three-dimensional structure, for example, a 3D NAND flash memory device, have been studied.

In the 3D NAND flash memory device, a plurality of program loops may be performed according to incremental step pulse programming (hereinafter, referred to as "ISPP") until the program is completed. As the number of program loops increases, a program voltage is applied to the memory cell in a series of pulses, and the size of the program pulses is increased by a desired and/or preset step size. In sections between program pulses, verification operations (or verification read operations) are performed. That is, verification operations are performed on the data state of the memory cell to determine whether the memory cell has reached a verification level related to its data.

One or more bits may be programmed in the memory cell to increase the capacity per unit area. A memory cell may be classified into a single level cell (SLC), a multi level cell (MLC), a triple level cell (TLC), or a quad level cell (QLC) according to the number of bits stored in the memory cell. The memory cell may have a plurality of program states according to the number of bits stored in the memory cell. The plurality of program states may be defined as a range of a threshold voltage. As MLCs (e.g., 4-state MLC, 8-state MLC, and 16-state MLC) are employed, the program time for performing the programming becomes longer. In particular, the number of verification operations performed increases in proportion to the number of program states, and this verification time occupies a large portion of the total program time.

Moreover, in the ideal data state of the programmed MLCs, a desired and/or preset voltage interval with the adjacent data state is maintained, so that a read margin is sufficiently secured. However, due to a high voltage repeatedly applied to a selected memory cell or an adjacent memory cell during a program operation of MLCs, the MLCs are affected by coupling and the like, so that the threshold voltage of each data state may be transformed into a non-ideal shape.

If the verification operations performed corresponding to verifying program states are reduced and/or skipped, an improvement to the program speed and program performance will be provided by decreasing, reducing, and/or minimizing the number of verification operations.

SUMMARY

Various example embodiments of the inventive concepts provide a memory device capable of determining a start point and an end point of a verification operation associated with a target state during programming, a system including the memory device, and/or a programming method of the memory device.

According to at least one example embodiment, there is provided a method of programming a memory device, the method including: applying program loops to a plurality of memory cells of the memory device to adjust threshold voltages of the plurality of memory cells to desired target states, each of the program loops including a program section and a verification section, the program section being a time period during which a program voltage is applied to the memory cells, and the verification section being a time period during which a verification voltage is applied to the memory cells, the program loops including first program loops performed on a first page and second program loops performed on a second page, programming the memory cells of the first page to a first target state during the program sections of the first program loops, storing a number of the first program loops used to complete the programming of the memory cells of the first page to the first target state, programming the memory cells of the second page to the first target state during the program sections of the second program loops, the second page adjacent to the first page, and performing a verification operation on the second page during at least one verification section of the second program loops performed on the second page, the performing the verification operation including determining whether the memory cells of the second page are programmed to the first target state, the performing the verification operation on the second page based on the stored number of the first program loops.

According to at least one example embodiment, there is provided a method of programming a memory device, the method including: programming a plurality of memory cells of a memory cell array to desired target states using program loops, each of the program loops including a program section and a verification section, the program section being a time period during which a program voltage is applied to the memory cells, and the verification section being a time period during which a verification voltage is applied to the memory cells, the program loops including first program loops performed on a first page of the memory cell array and second program loops performed on a second page of the memory cell array, programming the memory cells of the first page to a first target state, storing a number of the first program loops used to complete the programming of the memory cells of the first page to the first target state, programming the memory cells of the second page to the first target state during the program sections of the second program loops, the second page adjacent to the first page, calculating a verify offset number associated with the second page, the verify offset number calculated based on a shift amount of a threshold voltage distribution corresponding to the first target state of the second page and a voltage increment of the program voltage to be applied in the program loops, and performing a verification operation on the second page during at least one of the verification sections of the second program loops performed on the second page, the performing the verification operation including determining whether the memory cells of the second page are programmed to the first target state, the performing the verification operation on the second page based on a relationship between the stored number of the first program loops and the verify offset number.

According to at least one example embodiment, there is provided a memory device including: a memory cell array including a plurality of memory cells programmed with 3 bits of data per memory cell, the memory cell array including a first page and a second page, and a control circuit configured to control a program operation of the memory cell array so that threshold voltages of the memory cells of the first page and the second page have target states, the second page arranged adjacent to the first page, the program operation including performing a plurality of program loops on the memory cell array based on a voltage increment of a program voltage, the plurality of program loops including first program loops performed on the first page and second program loops performed on the second page, and each of the program loops comprises a program section and a verification section, the program section being a time period in which the program voltage is applied to the memory cells, and the verification section being a time period to apply a verification voltage to the memory cells, and the control circuit is further configured to store a number of the first program loops of the program loops used to complete the programming of the memory cells of the first page to a first target state, and determine which verification sections of the second program loops of the plurality of program loops to skip based on the stored number of first program loops and the voltage increment of the program voltage when programming the memory cells of the second page to the first target state.

BRIEF DESCRIPTION OF THE DRAWINGS

Various example embodiments of the inventive concepts will be more clearly understood from the following detailed description taken in conjunction with the accompanying drawings in which:

FIGS. 9 and 10 are diagrams for explaining a programming method according to some example embodiments of the inventive concepts;

DETAILED DESCRIPTION

Figure 1:
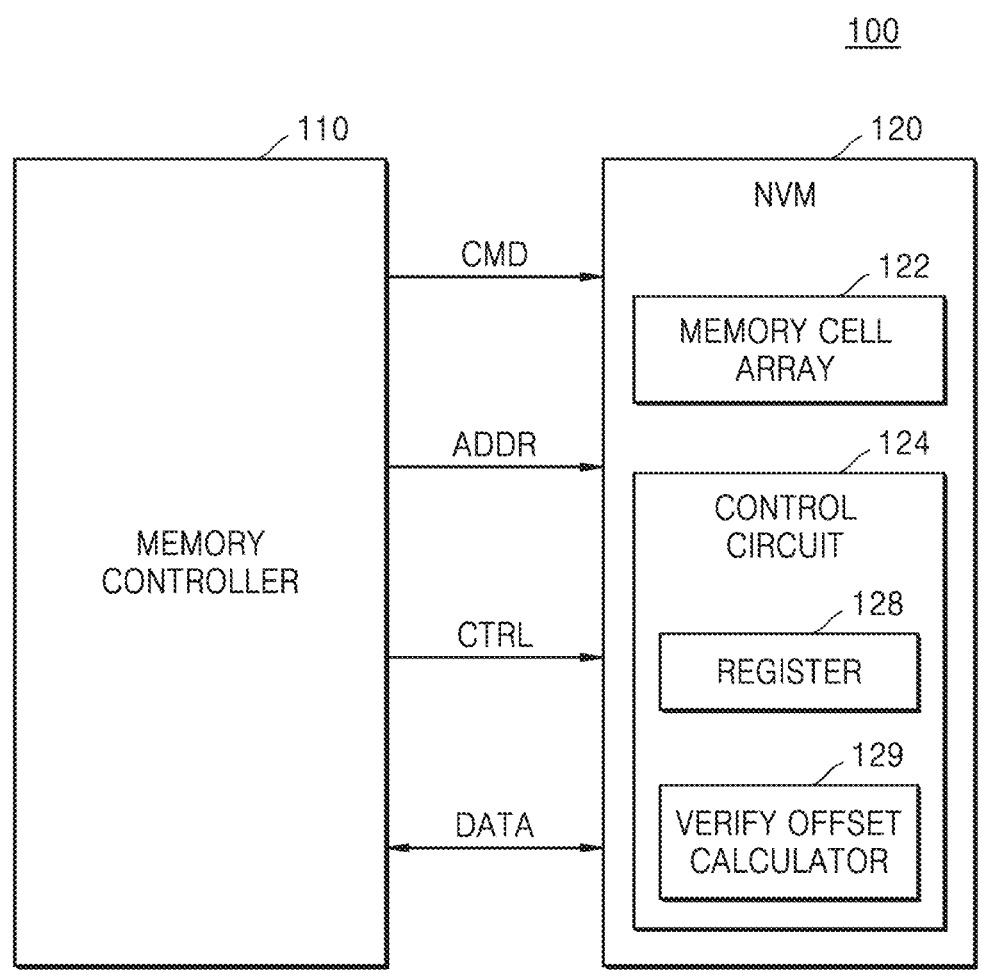
FIG. 1 is a block diagram illustrating a memory system according to some example embodiments of the inventive concepts.

FIG. 1 is a block diagram illustrating a memory system according to some example embodiments of the inventive concepts.

Referring to FIG. 1, the memory system 100 may include a memory controller 110 and/or at least one memory device 120, etc., but the example embodiments are not limited thereto. In at least one example embodiment, a plurality of conceptual hardware configurations included in the memory system 100 are illustrated, but the example embodiments of the inventive concepts are not limited thereto and other configurations are possible. The memory controller 110 may control the memory device 120 to write data to the memory device 120 in response to a write request from the host and/or control the memory device 120 to read data stored in the memory device 120 in response to a read request from the host.

In some example embodiments, the memory system 100 may be an internal memory that is embedded in an electronic device, but is not limited thereto. For example, the memory system 100 may be an embedded Universal Flash Storage (UFS) memory device, an embedded Multi-Media Card (eMMC), and/or a Solid State Drive (SSD), etc. In some example embodiments, the memory system 100 may be an external memory that is removable to the electronic device. For example, the memory system 100 may include at least one of a UFS memory card, Compact Flash (CF), Secure Digital (SD), Micro Secure Digital (Micro-SD), Mini Secure Digital (Mini-SD), Extreme Digital (xD), and/or Memory Stick, etc.

The memory device 120 may perform an erase, program, and/or read operation under the control of the memory controller 110, etc. The memory device 120 receives a command CMD and/or an address ADDR from the memory controller 110, and transmits and/or receives data DATA for a program operation or a read operation to/from the memory controller 110 through an input/output line. Also, the memory device 120 may receive the control signal CTRL through the control line. The memory device 120 may include a memory cell array 122 and/or a control circuit 124, etc., but is not limited thereto.

The memory cell array 122 includes a plurality of memory blocks, and each of the plurality of memory blocks may include a plurality of memory cells, and for example, the plurality of memory cells may be flash memory cells. Hereinafter, example embodiments of the inventive concepts will be described with reference to the case in which the plurality of memory cells are NAND flash memory cells as an example, however the example embodiments are not limited thereto. The memory cell array 122 may include a three-dimensional memory cell array including a plurality of cell strings, which will be described in detail with reference to FIGS. 3 and 4.

A three-dimensional memory cell array includes an active region arranged on a silicon substrate and a circuit related to the operation of the memory cells, and is formed monolithically on at least one physical level of memory cell arrays having circuitry formed on or within the substrate. The term "monolithic" means that the layers of each level constituting the array are stacked directly on top of the layers of each lower level of the array. In at least one example embodiment according to the inventive concepts, the three-dimensional memory cell array includes cell strings arranged in a vertical direction such that at least one memory cell is positioned on top of another memory cell. The at least one memory cell may include a charge trap layer. U.S. Pat. Nos. 7,679,133, 8,553,466, 8,654,587, 8,559,235, and U.S. Patent Application Publication No. 2011/0233648 are those detailing suitable configurations for a three-dimensional memory array in which a three-dimensional memory array is configured in multiple levels and word lines and/or bit lines are shared between the levels, and are incorporated by reference herein.

The control circuit 124 may include a register 128 and/or a verify offset calculator 129 (e.g., a verify offset calculator circuitry, etc.), but is not limited thereto. The control circuit 124 may control the program operation so that a plurality of threshold voltages of the memory cells of the first page and the memory cells of the second page arranged adjacent to the same position from the substrate of the 3D memory cell array 122 have a plurality of target states. The control circuit 124 may perform program operation using one or more program loops based on a voltage increase (e.g., an amount of voltage increase, etc.) of the program voltage, and each of the program loops may include at least one program section and at least one verification section, etc. According to some example embodiments, the control circuit 124, register 128, and/or verify offset calculator 129, etc., may be implemented as processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The control circuit 124 may store in the register 128 a number of program loops of the first target state related to the completion of programming of the memory cells of the first page to the first target state, for example, or in other words, the control circuit 124 may determine the number of program loops desired to program the first page to the first target state, and store the determined number of program loops corresponding to the first target state in the register 128 and/or other memory, etc. The control circuit 124 may calculate a verify offset using the verify offset calculator 129 based on a shift amount of the threshold voltage distribution corresponding to the first target state of the second page, and a voltage increment (e.g., an amount of voltage increase, etc.) of the program voltage to be applied in the program loops, but is not limited thereto.

When programming the memory cells of the second page to the first target state, the control circuit 124 may determine a start loop and/or an end loop of the verification operation from among the plurality of program loops based on the number of program loops of the first target state of the first page (e.g., the number of program loops to program the first page to the first target state, etc.) and/or the voltage increase of the program voltage, but the example embodiments are not limited thereto.

When programming the memory cells of the second page to the first target state, the control circuit 124 may apply the number of program loops of the first target state of the first page (e.g., the number of program loops to program the first page to the first target state, etc.) stored in the register 128 as an end loop of the verification operation of the first target state of the second page, etc. When programming the memory cells of the second page to the first target state, the control circuit 124 may apply the lowest program loop of the program loops corresponding to a number of verify offsets among the program loops (e.g., the number of verify offset operations included in the plurality of program loops) before the end loop of the verification operation as the start loop of the verification operation, etc., but the example embodiments are not limited thereto. The control circuit 124 may perform the verification operation of the first target state of the second page starting from a start loop of the verification operation until an end loop of the verification operation is reached. The control circuit 124 may omit and/or delay the verification operation of the first target state of the second page until a start loop of the verification operation is reached among the plurality of program loops before the end loop of the verification operation, but the example embodiments are not limited thereto.

Figure 2:
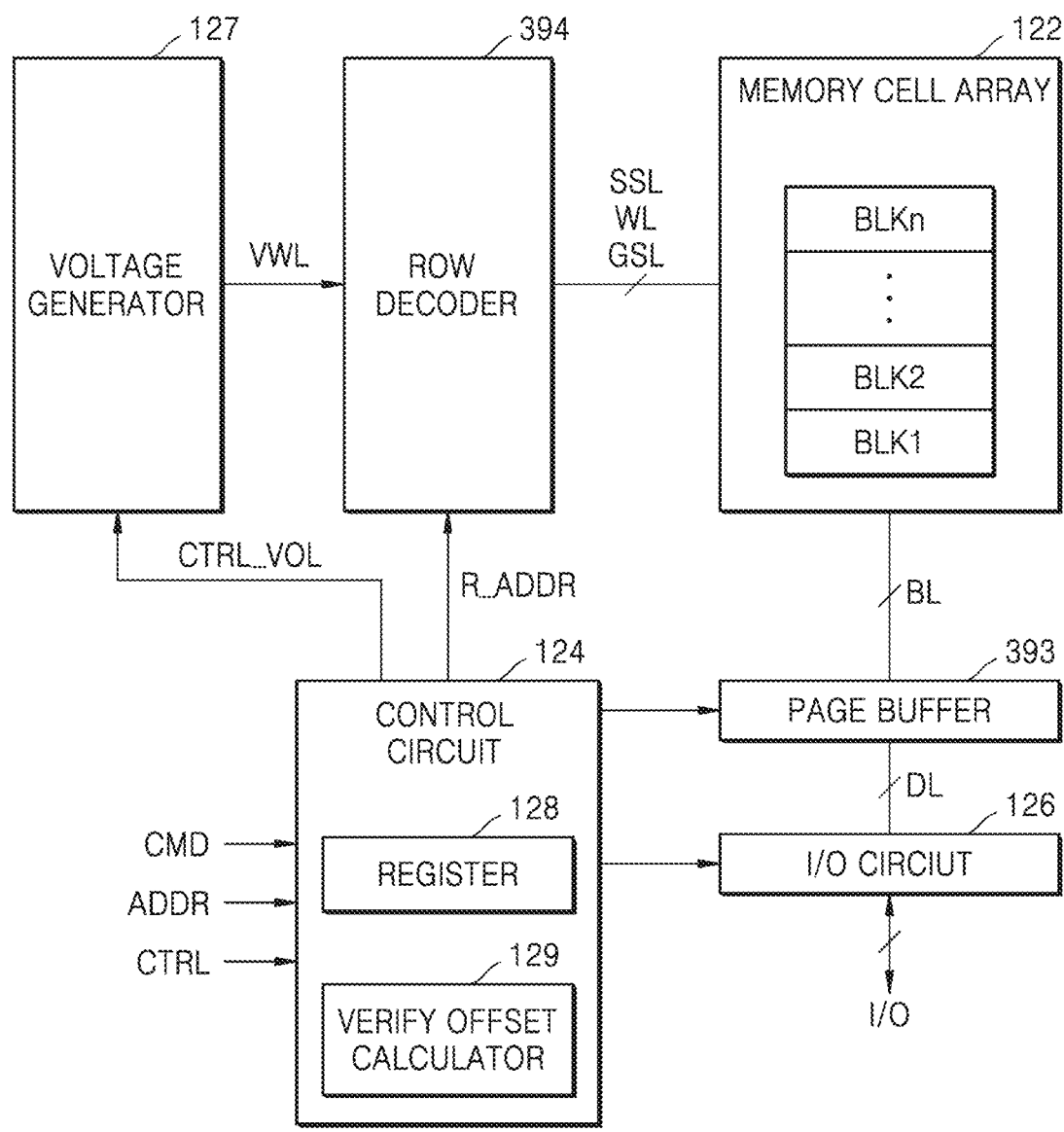
FIG. 2 is a block diagram illustrating a memory device according to some example embodiments of the inventive concepts.

FIG. 2 is a block diagram illustrating a memory device according to some example embodiments of the inventive concepts.

Referring to FIGS. 1 and 2, the memory device 120 may include a memory cell array 122, a row decoder 394, a control circuit 124 (e.g., control circuitry, etc.), a page buffer unit 393, an input/output (I/O) circuit 126, and/or a voltage generator 127, etc., but is not limited thereto, and for example, may include a greater or lesser number of constituent components. For example, although not shown, the memory device 120 may further include an I/O interface, etc.

The memory cell array 122 may be connected to the word lines WL, the string select lines SSL, the ground select lines GSL, and the bit lines BL, etc. The memory cell array 122 may be connected to the row decoder 394 through word lines WL, string select lines SSL, and ground select lines GSL, and may be connected to the page buffer 393 through the bit lines BL, etc. The memory cell array 122 may include a plurality of memory blocks BLK1 to BLKn.

Each of the memory blocks BLK1 to BLKn may include a plurality of memory cells and/or a plurality of select transistors, etc. The memory cells may be connected to the word lines WL, and the select transistors may be connected to the string select lines SSL and/or the ground select lines GSL, etc. Memory cells of each of the memory blocks BLK1 to BLKn may include single-level cells storing 1-bit data or multi-level cells storing M (M is an integer of 2 or greater)-bit data.

The row decoder 394 may select one of the plurality of memory blocks BLK1 to BLKn of the memory cell array 122, select one of the word lines WL of the selected memory block, and select one of the plurality of string select lines SSL.

The control circuit 124 may output various internal control signals for performing program, read, and/or erase operations on the memory cell array 122 based on the command CMD, the address ADDR, and/or the control signal CTRL transmitted from the memory controller 110, but is not limited thereto. The control circuit 124 may provide a row address R_ADDR to the row decoder 394, provide a column address to the I/O circuit 126, and/or provide a voltage control signal CTRL_VOL to the voltage generator 127, etc.

The control circuit 124 may control a program operation so that threshold voltages of memory cells of a first page (e.g., a previous page, etc.) and a second page (e.g., a current page, a next page, etc.) arranged adjacent to the first page and at the same height from the substrate in the memory cell array 122 have a plurality of target states.

The control circuit 124 may store, in the register 128, the number of program loops of the first target state related to the completion of programming of the memory cells of the previous page to the first target state, for example. The control circuit 124 may calculate the verify offset using the verify offset calculator 129 based on the shift amount of the threshold voltage distribution (e.g., the detected and/or determined amount of change in the threshold voltage, etc.) corresponding to the first target state of the next page and the voltage increment of the program voltage (e.g., the amount of the program voltage was incremented) to be applied in the program loops. While programming the memory cells of the next page to the first target state, the control circuit 124 may determine a start loop and an end loop of the verification operation from among the plurality of program loops based on the number of program loops of the first target state of the previous page (e.g., the amount of program loops used to program the previous page to the first target state, etc.) and the voltage increase of the program voltage of the next page, etc.

While programming the memory cells of the next page (e.g., the second page) to the first target state, the control circuit 124 may apply the number of program loops of the first target state of the previous page stored in the register 128 as an end loop of the verification operation of the first target state of the next page. In other words, the control circuit 124 may retrieve the stored number of program loops used during the programming of the previous page to the first target state from the register 128, and perform the programming of the next page to the first target state based on the retrieved number of program loops, etc. While programming the memory cells of the next page to the first target state, the control circuit 124 may apply the lowest program loop of the program loops corresponding to the number of verify offsets among the program loops before the end loop of the verification operation as the start loop of the verification operation. The control circuit 124 may perform the verification operation of the first target state of the next page from a start loop of the verification operation until an end loop of the verification operation is reached, but the example embodiments are not limited thereto. The control circuit 124 may omit and/or delay the verification operation of the first target state of the next page until a start loop of the verification operation is reached among program loops before the end loop of the verification operation.

The page buffer 393 may operate as a write driver and/or a sense amplifier according to an operation mode. During a read operation, the page buffer 393 may sense the bit line BL of the selected memory cell under the control of the control circuit 124. The sensed data may be stored in latches provided in the page buffer 393, but is not limited thereto. The page buffer 393 may dump and/or transfer data stored in the latches to the I/O circuit 126 through the data line DL under the control of the control circuit 124, etc.

The I/O circuit 126 may temporarily store the command CMD, the address ADDR, and/or the data DATA provided from the outside of (e.g., external to) the non-volatile memory device 120 through the input/output line I/O. The I/O circuit 126 may temporarily store read data of the non-volatile memory device 120 and/or output the read data to the outside through the input/output line I/O at a specified time, etc.

The voltage generator 127 may generate various types of voltages to perform program, read, and/or erase operations on the memory cell array 122 based on the voltage control signal CTRL_VOL. In particular, the voltage generator 127 may generate a word line voltage VWL, for example, a program voltage, a verify voltage, a read voltage, a pass voltage, an erase voltage, an erase verify voltage, and the like.

Figure 3:
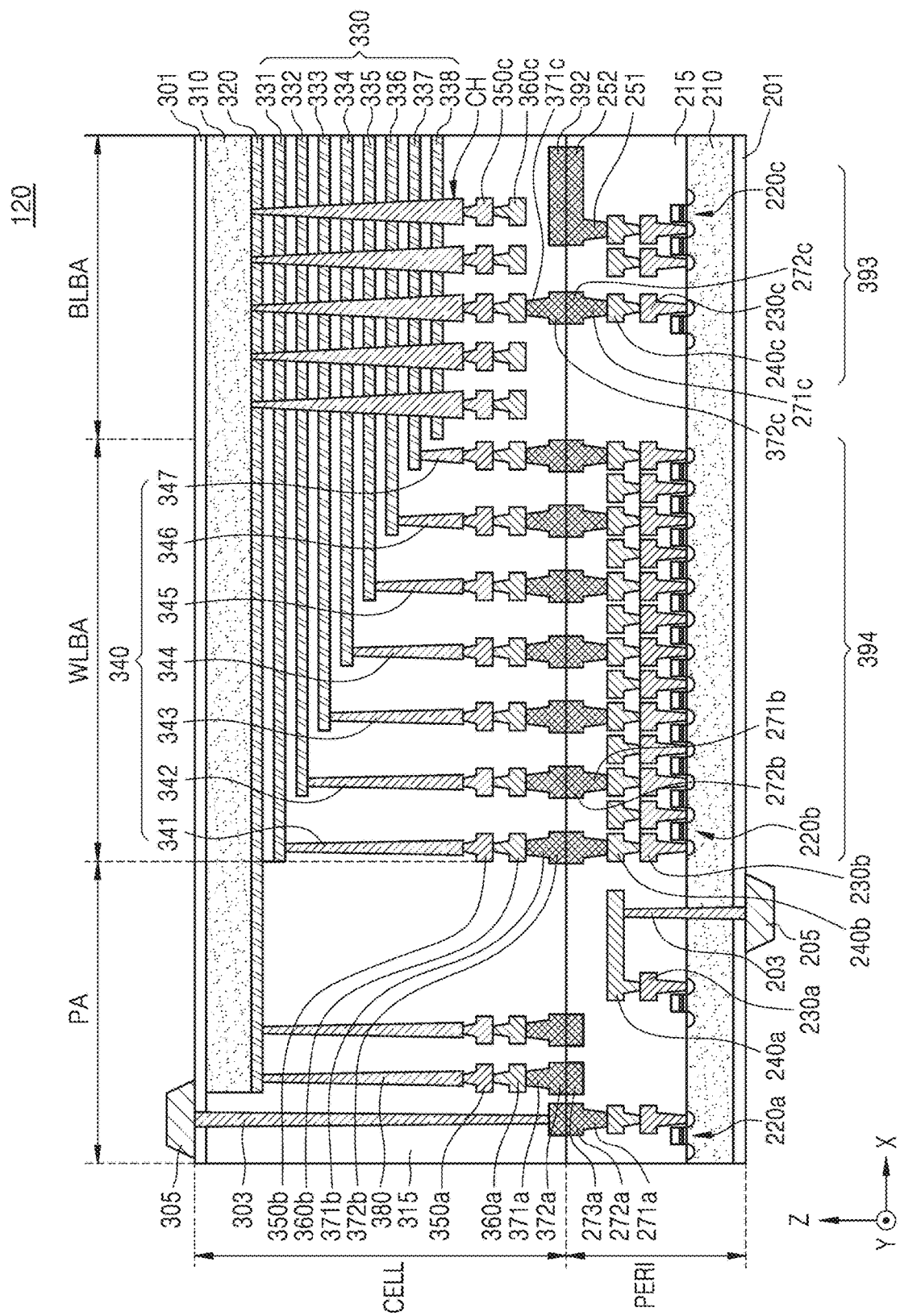
FIG. 3 is a diagram for explaining a structure of a memory device according to some example embodiments of the inventive concepts.

FIG. 3 is a diagram illustrating a structure of a memory device according to some example embodiments of the inventive concepts.

Referring to FIG. 3, a memory device 120 may have a chip-to-chip (C2C) structure, but the example embodiments are not limited thereto, and may have alternate chip structures. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. However, the example embodiments of the inventive concepts are not limited thereto. For example, the bonding metals may also be formed of aluminum (Al), or tungsten (W), etc.

Each of the peripheral circuit region PERI and the cell region CELL of the memory device 120 may include an external pad bonding area PA, a word line bonding area WLBA, and a bit line bonding area BLBA, etc.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c, etc. In at least one example embodiment, the first metal layers 230a, 230b, and 230c may be formed of tungsten having relatively high electrical resistivity, and the second metal layers 240a, 240b, and 240c may be formed of copper having relatively low electrical resistivity, but the example embodiments are not limited thereto.

In the at least one example embodiment illustrated in FIG. 3, although only the first metal layers 230a, 230b, and 230c and the second metal layers 240a, 240b, and 240c are shown and described, the example embodiments of the inventive concepts are not limited thereto. For example, one or more additional metal layers may be further formed on the second metal layers 240a, 240b, and 240c, etc. At least a portion of the one or more additional metal layers formed on the second metal layers 240a, 240b, and 240c may be formed of aluminum and/or another metal having a lower electrical resistivity than those of copper forming the second metal layers 240a, 240b, and 240c, but are not limited thereto.

The interlayer insulating layer 215 may be disposed on the first substrate 210 and cover the plurality of circuit elements 220a, 220b, and 220c, the first metal layers 230a, 230b, and 230c, and/or the second metal layers 240a, 240b, and 240c. The interlayer insulating layer 215 may include an insulating material such as silicon oxide or silicon nitride, but is not limited thereto.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, and/or tungsten, but is not limited thereto. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320, but is not limited thereto. On the second substrate 310, a plurality of word lines 331 to 338 (e.g., 330) may be stacked in a direction (e.g., a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line, but the example embodiments are not limited thereto.

In the bit line bonding area BLBA, a channel structure CH may extend in a direction (e.g., a Z-axis direction), perpendicular to the upper surface of the second substrate 310, and pass through the plurality of word lines 330, the at least one string select line, and the at least one ground select line, etc. The channel structure CH may include a data storage layer, a channel layer, and/or a buried insulating layer, etc., and the channel layer may be electrically connected to a first metal layer 350c and/or a second metal layer 360c, etc., but is not limited thereto. For example, the first metal layer 350c may be a bit line contact, and the second metal layer 360c may be a bit line, etc. In at least one example embodiment, the bit line 360c may extend in a first direction (e.g., a Y-axis direction), parallel to the upper surface of the second substrate 310, but is not limited thereto.

In the at least one example embodiment illustrated in FIG. 3, an area in which the channel structure CH, and the bit line 360c are disposed may be defined as the bit line bonding area BLBA, but the example embodiments are not limited thereto. In the bit line bonding area BLBA, the bit line 360c may be electrically connected to the circuit elements 220c including a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393, but is not limited thereto.

In the word line bonding area WLBA, the plurality of word lines 330 may extend in a second direction (e.g., an X-axis direction), parallel to the upper surface of the second substrate 310 and perpendicular to the first direction, and may be connected to a plurality of cell contact plugs 341 to 347 (e.g., 340). The plurality of word lines 330 and the plurality of cell contact plugs 340 may be connected to each other in pads provided by at least a portion of the plurality of word lines 330 extending at different lengths in the second direction, but not limited thereto. A first metal layer 350b and a second metal layer 360b may be connected to an upper portion of the plurality of cell contact plugs 340 connected to the plurality of word lines 330, sequentially, but not limited thereto. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA, but the example embodiments are not limited thereto.

The plurality of cell contact plugs 340 may be electrically connected to the circuit elements 220b forming a row decoder 394 in the peripheral circuit region PERI. In at least one example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394, but is not limited thereto.

A common source line contact plug 380 may be disposed in the external pad bonding area PA, but the example embodiments are not limited thereto. The common source line contact plug 380 may be formed of a conductive material such as a metal, a metal compound, and/or polysilicon, etc., and may be electrically connected to the common source line 320. A first metal layer 350a and a second metal layer 360a may be stacked on an upper portion of the common source line contact plug 380, sequentially, but are not limited thereto. For example, an area in which the common source line contact plug 380, the first metal layer 350a, and/or the second metal layer 360a are disposed may be defined as the external pad bonding area PA.

Input-output pads 205 and 305 may be disposed in the external pad bonding area PA, but are not limited thereto. Referring to FIG. 3, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201, but is not limited thereto. In addition, a side insulating film may be disposed between the first input-output contact plug 203 and the first substrate 210 to electrically separate the first input-output contact plug 203 and the first substrate 210, but the example embodiments are not limited thereto.

Referring to FIG. 3, an upper insulating film 301 covering the upper surface of the second substrate 310 may be formed on the second substrate 310, and a second input-output pad 305 may be disposed on the upper insulating layer 301, etc. The second input-output pad 305 may be connected to at least one of the plurality of circuit elements 220a, 220b, and 220c disposed in the peripheral circuit region PERI through a second input-output contact plug 303, etc. In at least one example embodiment, the second input-output pad 305 is electrically connected to a circuit element 220a.

According to at least one example embodiment, the second substrate 310 and the common source line 320 are not disposed in an area in which the second input-output contact plug 303 is disposed, but the example embodiments are not limited thereto. Also, the second input-output pad 305 does not overlap the word lines 330 in the third direction (e.g., the Z-axis direction), but the example embodiments are not limited thereto. Referring to FIG. 3, the second input-output contact plug 303 may be separated from the second substrate 310 in a direction parallel to the upper surface of the second substrate 310, and may pass through the interlayer insulating layer 315 of the cell region CELL to be connected to the second input-output pad 305, but the example embodiments are not limited thereto.

According to at least one example embodiment, the first input-output pad 205 and/or the second input-output pad 305 are selectively formed. For example, the memory device 120 may include only the first input-output pad 205 disposed on the first substrate 210 and/or the second input-output pad 305 disposed on the second substrate 310. Additionally, the memory device 120 may include both the first input-output pad 205 and the second input-output pad 305, etc.

A metal pattern provided on an uppermost metal layer may be provided as a dummy pattern and/or the uppermost metal layer may be absent in each of the external pad bonding area PA and the bit line bonding area BLBA, respectively included in the cell region CELL and the peripheral circuit region PERI, but the example embodiments are not limited thereto.

In the external pad bonding area PA, the memory device 120 may include a lower metal pattern 273a corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, in at least one example embodiment, the lower metal pattern 273a formed in the uppermost metal layer of the peripheral circuit region PERI is not connected to a contact, but is not limited thereto. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL, but the example embodiments are not limited thereto.

The lower bonding metals 271b and 272b may be formed on the second metal layer 240b in the word line bonding area WLBA, but are not limited thereto. In the word line bonding area WLBA, the lower bonding metals 271b and 272b of the peripheral circuit region PERI may be electrically connected to the upper bonding metals 371b and 372b of the cell region CELL by a Cu-to-Cu bonding, etc.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL, but the example embodiments are not limited thereto. In at least one example embodiment, a contact is not formed on the upper metal pattern 392 formed in the uppermost metal layer of the cell region CELL.

In at least one example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI, but the example embodiments are not limited thereto. In at least one example embodiment, a contact is not formed on the reinforcement metal pattern.

Figure 4:
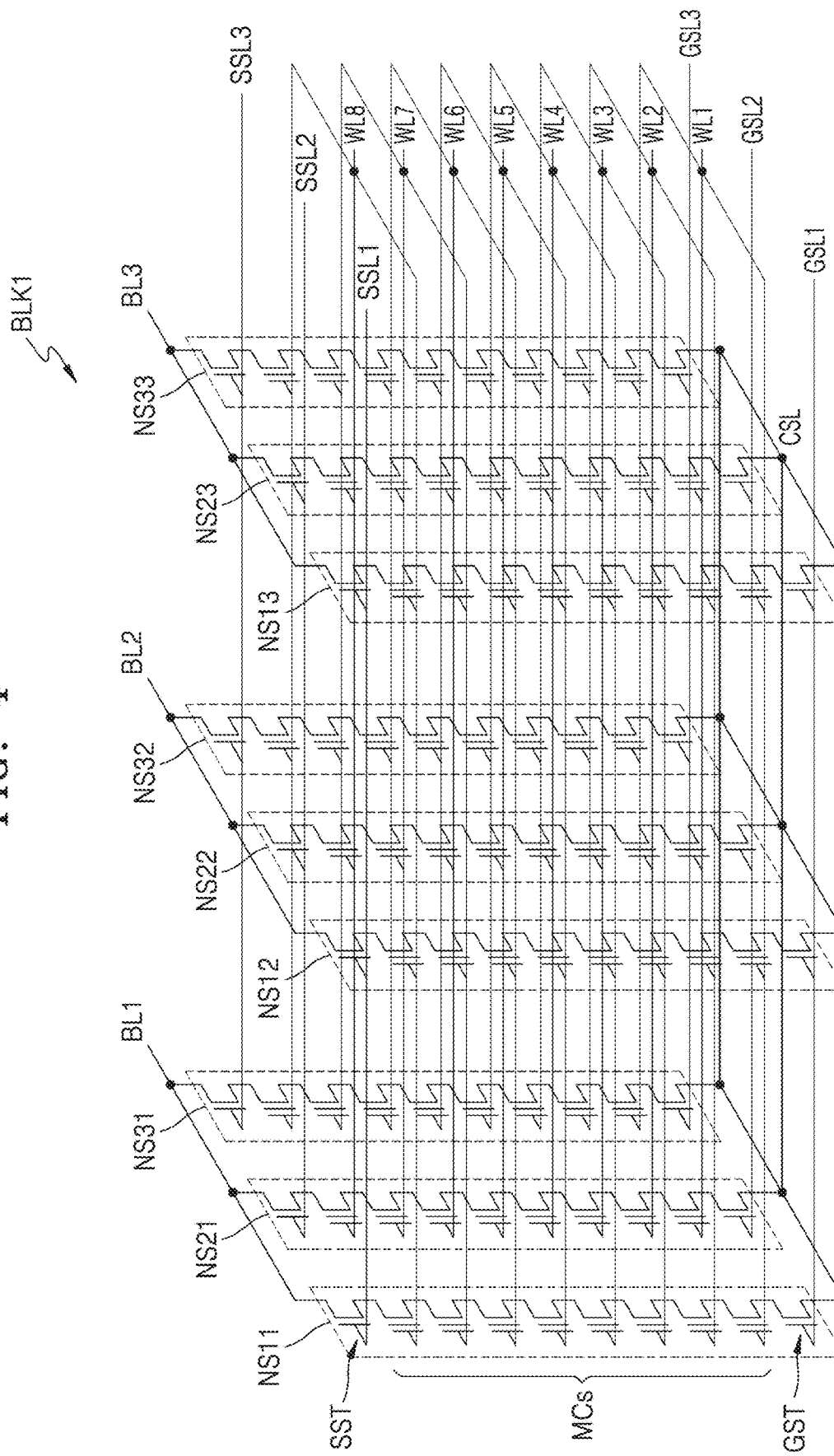
FIG. 4 shows an equivalent circuit diagram of the memory block of FIG. 2 according to at least one example embodiment.

FIG. 4 shows an equivalent circuit diagram of the memory block of FIG. 2. The memory block illustrated in FIG. 4 shows a first memory block BLK1 as an example of one of the plurality of memory blocks BLK1 to BLKn described with reference to FIG. 2, but the example embodiments are not limited thereto. Hereinafter, some example embodiments of the inventive concepts will be described in detail taking the first memory block BLK1 as an example, but are not limited thereto. The first memory block BLK1 represents a three-dimensional memory block formed on a substrate in a three-dimensional structure. The plurality of memory cell strings included in the first memory block BLK1 may be formed in a direction perpendicular to the substrate.

Referring to FIG. 4, the first memory block BLK1 may include a plurality of NAND strings NS11 to NS33, a plurality of word lines WL1 to WL8, a plurality of bit lines BL1 to BL3, a plurality of ground select lines GSL1 to GSL3, a plurality of string select lines SSL1 to SSL3, and/or a common source line CSL, etc., but the example embodiments are not limited thereto. Although it is illustrated in FIG. 4 that each of the cell strings NS11 to NS33 includes eight memory cells MCs connected to eight word lines WL1 to WL8, the example embodiments of the inventive concepts are not limited thereto, and the memory blocks may include a greater or lesser number of cell strings, word lines, bit lines, ground select lines, string select lines, and/or common source lines, etc.

Each cell string (e.g., NS11, etc.) may include a string select transistor SST, a plurality of memory cells MC, and/or a ground select transistor GST connected in series, but are not limited thereto. The string select transistor SST is connected to the corresponding string select line SSL1. The plurality of memory cells MC are respectively connected to corresponding word lines WL1 to WL8. The ground select transistor GST is connected to the corresponding ground select line GSL1. The string select transistor SST is connected to the corresponding bit lines BL1 to BL3, and the ground select transistor GST is connected to the common source line CSL.

According to at least one example embodiment, in each cell string, one or more dummy memory cells may be provided between the string select transistor SST and the memory cells MC, but the example embodiments are not limited thereto. In each cell string, one or more dummy memory cells may be provided between the ground select transistor GST and the memory cells MC. In each cell string, one or more dummy memory cells may be provided between the memory cells MC. The dummy memory cells may have the same structure as the memory cells MC, and may be unprogrammed (e.g., program prohibited, etc.) or programmed differently from the memory cells MC. For example, when the memory cells MC are programmed to have two or more threshold voltage distributions, the dummy memory cells may be programmed to have one threshold voltage distribution range and/or a smaller number of threshold voltage distributions than the memory cells MC, but the example embodiments are not limited thereto.

Figure 5A:
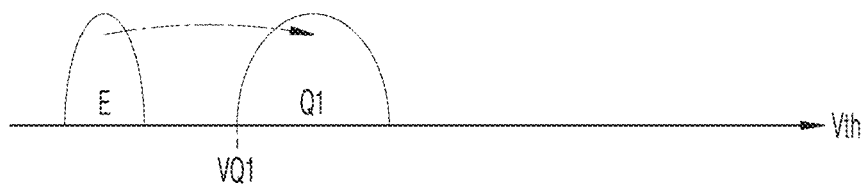
FIGS. 5A to 5C are diagrams for explaining a programming method according to some example embodiments of the inventive concepts.
Figure 5B:
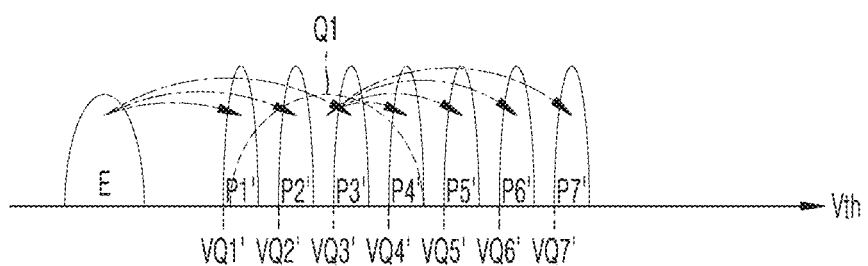
Figure 5C:
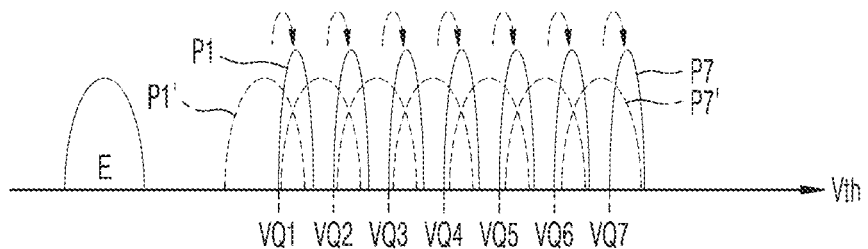

FIGS. 5A to 5C are diagrams for explaining a programming method according to some example embodiments of the inventive concepts. For the sake of clarity and brevity, it is assumed that the memory device according to at least one example embodiment of the inventive concepts stores 3-bit data per memory cell and performs a program operation according to a 2-step program method, but the example embodiments are not limited thereto, and the memory device may include memory cells storing less than 3-bit data, or more than 3-bit data, and/or may include more or less steps in its program method, etc. A programming method according to the 2-step programming method will be described below.

First, according to at least one example embodiment, first page data may be simultaneously stored in the memory cells of the selected word line, but the example embodiments are not limited thereto. As shown in FIG. 5A, the memory cells belonging to the threshold voltage distributions corresponding to the erase state E will be programmed to have a plurality of threshold voltages belonging to the threshold voltage distributions corresponding to the program state Q1 according to data to be programmed.

Then, two-page data, e.g., second and third page data, will be simultaneously stored in the memory cells of a selected word line. As shown in FIG. 5B, the memory cells belonging to the threshold voltage distributions corresponding to the program states P1' to P3' will be programmed to have threshold voltages belonging to the threshold voltage distributions corresponding to the program state Q1 according to data to be programmed, but are not limited thereto. Memory cells belonging to the threshold voltage distribution corresponding to the program state Q1 of FIG. 5A are to be programmed to have threshold voltages belonging to the threshold voltage distributions respectively corresponding to the program states P4' to P7' according to data to be programmed, but are not limited thereto.

Here, the verification voltages VP1' to VP7' used to determine the threshold voltage distributions P1' to P7' are less than the verification voltages VP1 to VP7 used to determine the final threshold voltage distributions P1 to P7 (e.g., see FIG. 5C). For example, the verification voltage VP1' used to determine the threshold voltage distribution P1' is less than the verification voltage VP1 used to determine the corresponding final threshold voltage distribution P1, etc. The operation of programming the memory cells to have the threshold voltage distributions shown in FIG. 5B is called a coarse program operation, and memory cells belonging to the threshold voltage distributions P1' to P7' are programmed to have the final threshold voltage distributions P1 to P7. Such an operation is referred to as a fine program operation (and/or called a reprogram operation, etc).

Each of the programming methods described in FIGS. 5A, 5B, and 5C may include verification operations for determining whether the memory cells have been programmed to have threshold voltages of proper threshold voltage distributions. This will be explained in additional detail below.

Figure 6A:
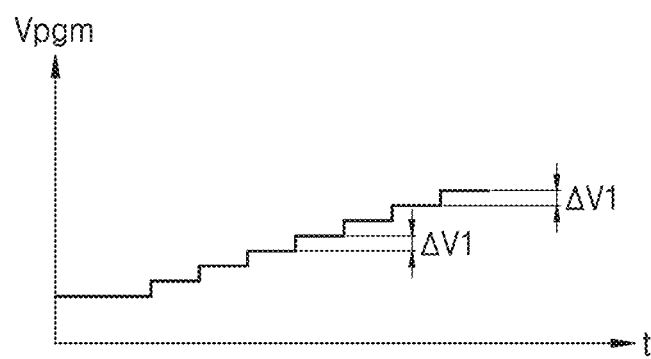
FIGS. 6A to 7B are diagrams for explaining a programming method according to some example embodiments of the inventive concepts.
Figure 6B:
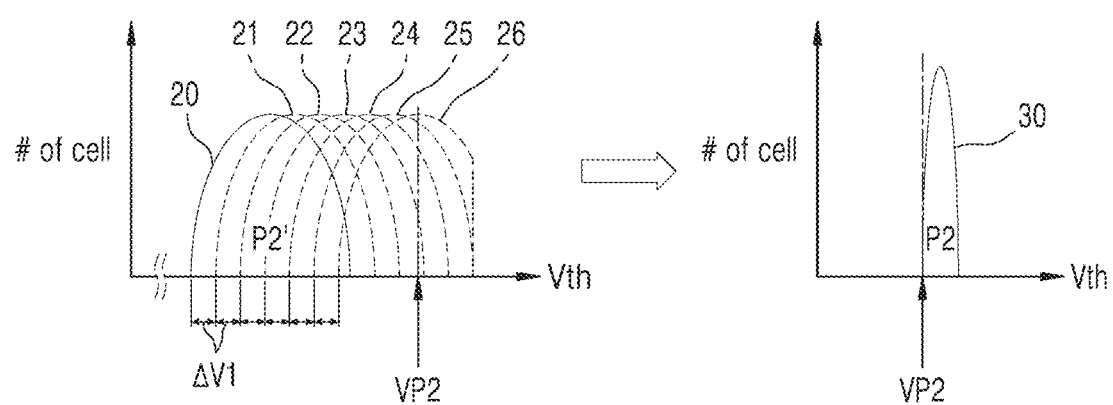
Figure 7A:
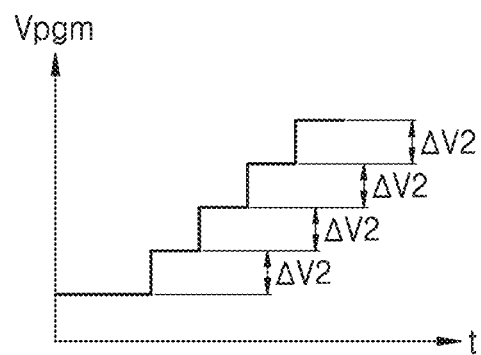
Figure 7B:
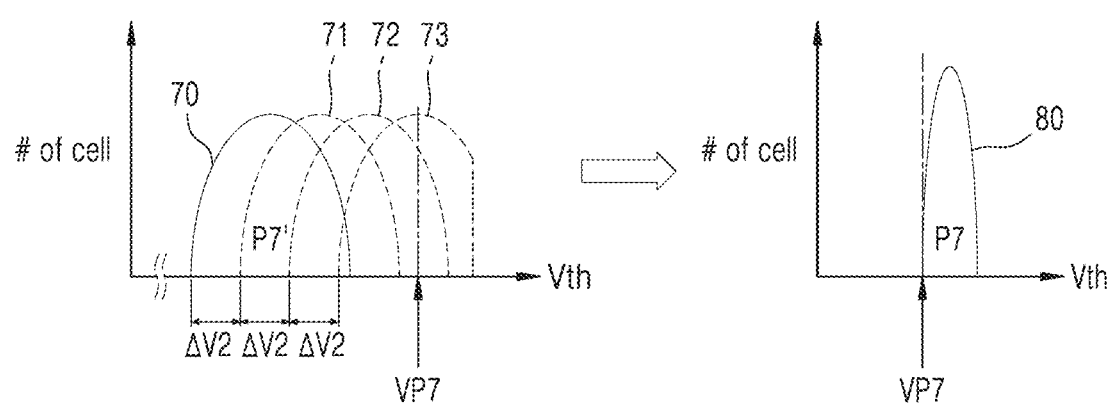

FIGS. 6A to 7B are diagrams for explaining a programming method according to some example embodiments of the inventive concepts. FIGS. 6A and 7A show examples of generation of a program voltage Vpgm to be applied in each program loop according to an ISPP program scheme according to some example embodiments. FIG. 6A illustrates a case in which a first voltage increment $\Delta V1$ is applied to each program loop according to the ISPP program scheme, and FIG. 7A illustrates an example case in which a second voltage increment $\Delta V2$ greater than the first voltage increment $\Delta V1$ is applied to each program loop. FIGS. 6B and 7B show threshold voltage distributions according to the ISPP program scheme of FIGS. 6A and 7A according to some example embodiments.

Referring to FIGS. 6A and 6B, the memory cells may be programmed by applying and/or using a plurality of step pulse voltages having a first voltage increment $\Delta V1$, which causes the memory cells to shift from the first threshold voltage distribution 20 to the second threshold voltage distribution 30, but the example embodiments are not limited thereto. The shift of the threshold voltage caused by each step pulse voltage may be performed by F—N tunneling in the case of a NAND flash memory, but the example embodiments are not limited thereto. As providing a pulse voltage that is constantly increased by the first voltage increment $\Delta V1$ to the word line of the selected memory cells, the distribution of memory cells shifts in the order of, for example, 20→21→22→23→24→25→26→ . . . →30 sequentially, but is not limited thereto. Moreover, the threshold voltage distribution of cells finally formed after the end of the program may be maintained as the reference number 30, but is not limited thereto.

Referring to FIGS. 7A and 7B, the memory cells are programmed by applying and/or using a plurality of step pulse voltages having a second voltage increment $\Delta V2$, which cause the memory cells to be shifted from the third threshold voltage distribution 70 to the fourth threshold voltage distribution 80, but the example embodiments are not limited thereto. As providing a pulse voltage that is constantly increased by the second voltage increment $\Delta V2$ to the word line of the selected memory cells, the distribution of memory cells shifts in the order of, e.g., 70→71→72→73→ . . . →80 sequentially, but is not limited thereto. Moreover, the threshold voltage distribution of cells finally formed after the end of the program may be maintained as the reference number 80, but is not limited thereto.

Referring to FIGS. 6B and 7B, the second voltage increment $\Delta V2$ used to generate the plurality of step pulse voltages is greater than the first voltage increment $\Delta V1$, but the example embodiments are not limited thereto. Therefore, the voltage shift in each program loop when the second voltage increment $\Delta V2$ is applied is greater than the voltage shift when the first voltage increment $\Delta V1$ is applied. On the other hand, when the same voltage shifts using the second voltage increment $\Delta V2$, the number of program loops used to program the memory cells is less than the number of program loops used when the first voltage increment $\Delta V1$ is applied.

Here, the small number of desired and/or required program loops (e.g., used program loops, applied program loops, etc.) means that the programming speed is faster because the number of repeated programs is smaller. Conversely, a larger number of used and/or applied program loops means that the programming speed is slower because the number of repeated programs is larger, etc.

According to at least one example embodiment, the programming method described in FIGS. 6A and 6B may be applied when programming memory cells belonging to the threshold voltage distribution corresponding to, for example, the erase state E described with reference to FIGS. 5A to 5C into the program states P1' to P3', but the example embodiments are not limited thereto. That is, the programming method described in FIGS. 6A and 6B may be applied when programming memory cells having a relatively slow program speed, may be applied when a more energy efficient programming method is desired, and/or may be applied when a faster programming speed for memory cells is desired, etc. For example, the threshold voltage distribution 20 of FIG. 6B may indicate a shift amount of the threshold voltage distribution P2', and the threshold voltage distribution 30 may correspond to the threshold voltage distribution P2 after being programmed, but the example embodiments are not limited thereto. A value (W1/$\Delta V1$) obtained by dividing the window size W1 of the threshold voltage distribution P2' by the first voltage increment $\Delta V1$ may be determined as a desired and/or minimum number of verifications. As an example, in FIG. 6B, at least six verification operations may be used to determine whether the program is programmed to have threshold voltages of the threshold voltage distribution P2, but the example embodiments are not limited thereto.

According to at least one example embodiment, the programming method described in FIGS. 7A and 7B may be applied when the memory cells belonging to the threshold voltage distribution corresponding to the program state Q1 described with reference to FIGS. 5A to 5C are programmed into the program states P4' to P7', but the example embodiments are not limited thereto. That is, the programming method described in FIGS. 6A and 6B may be applied when programming memory cells already having a relatively fast program speed. For example, the threshold voltage distribution 70 of FIG. 7B may indicate a shift amount of the threshold voltage distribution P7', and the threshold voltage distribution 30 may correspond to the programmed threshold voltage distribution P7. A value (W2/ΔV2) obtained by dividing the window size W2 of the threshold voltage distribution P7' by the first voltage increment ΔV2 may be determined as a desired and/or minimum number of verifications. In FIG. 7B, at least three verification operations may be desired and/or required to determine whether the program is programmed to have threshold voltages of the threshold voltage distribution P7.

Meanwhile, when the memory cells belonging to the threshold voltage distribution corresponding to the erase state E described in FIGS. 5A to 5C are programmed into the program states P1' to P3', the shift amount of the threshold voltage distribution may vary. The shift amount of the threshold voltage distribution when shifting from the erased state E to the data state P1' is the smallest, and the shift amount of the threshold voltage distribution when shifting to the data state P3' is the largest, but the example embodiments are not limited thereto. For this example, the deformation degree of the threshold voltage that may be generated will be the largest in the data state P3' and will be the smallest in the data state P1', etc.

Similarly, when the memory cells belonging to the threshold voltage distribution corresponding to the data state Q1 described with reference to FIGS. 5A to 5C are programmed into the program states P4' to P7', the shift amount of the threshold voltage distribution may vary. For example, the shift amount of the threshold voltage distribution when shifting from the data state Q1 to the data state P4' is the smallest, and the shift amount of the threshold voltage distribution when shifting to the data state P7' is the largest, etc. Accordingly, the deformation degree of the threshold voltage that may be generated will be the largest in the data state P7' and will be the smallest in the data state P4', etc.

The desired and/or minimum number of verifications for the program states P1 to P7 may vary according to a shift amount of the threshold voltage distribution, a voltage increment of a program voltage to be applied in each program loop, and/or a degree of transformation of a threshold voltage as described with reference to FIGS. 6B and 7B, but the example embodiments are not limited thereto. This difference in the number of verifications may be referred to as a verify offset (e.g., verify offset value, verify offset number, etc.). For example, as shown in FIG. 10, the P2 threshold voltage distribution may have 7 verify offsets, and the P7 threshold voltage distribution may have 6 verify offsets, etc.

During the program operation described with reference to FIGS. 5A to 7B, a verification start point (e.g., verification start loop, etc.) of the program state may be determined depending on and/or based on the verify offset for the program states P1 to P7 and/or the number of program loops desired and/or required in the program. The number of program loops required in a program may be determined by using and/or based on pass loop information obtained in a previous page program procedure of a selected word line. As the verification start loop is determined, the program verification before the verification start loop may be partially skipped for the program loops of the program states P1 to P7, etc.

Figure 8:
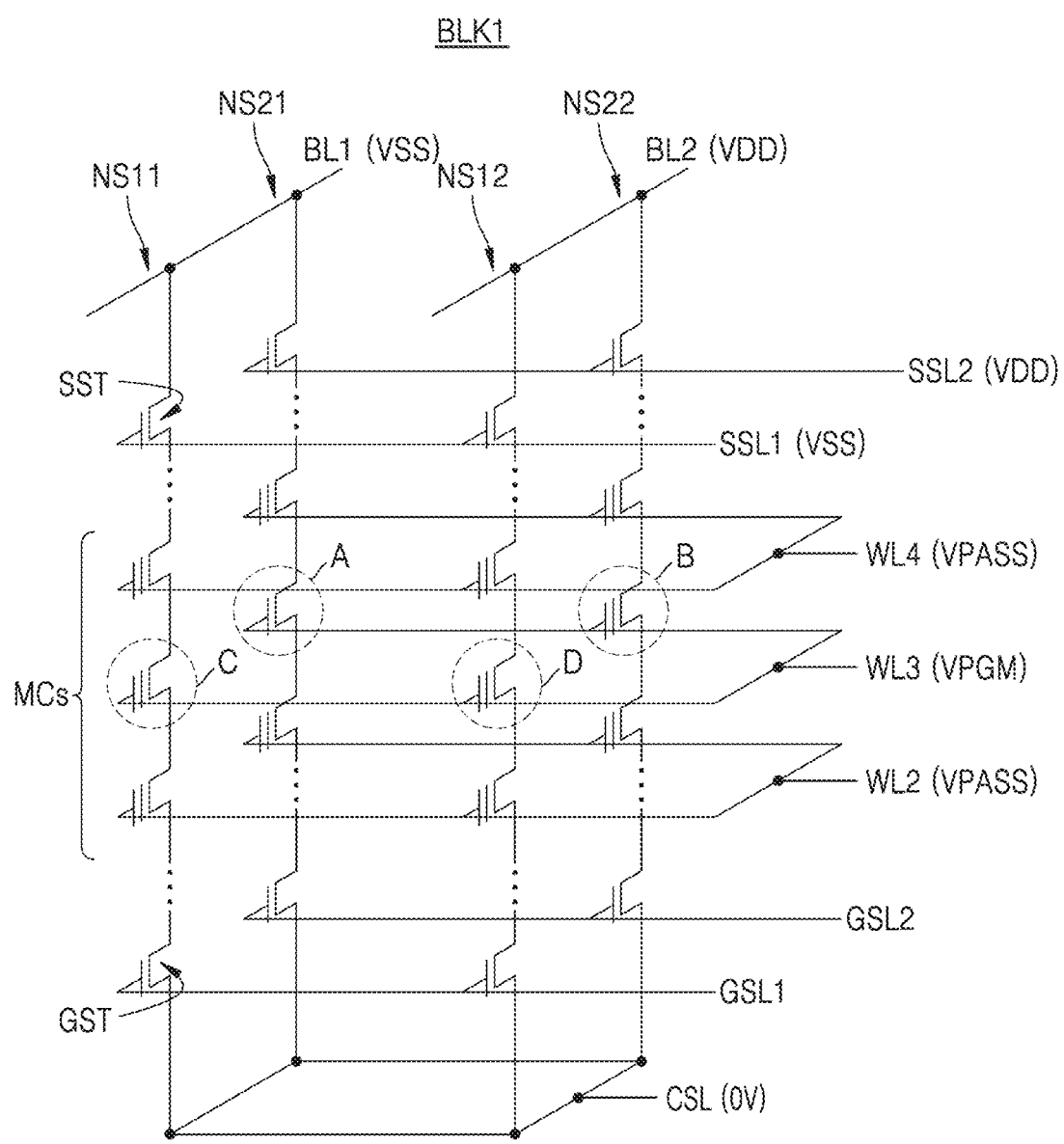
FIG. 8 is a diagram illustrating a program bias condition according to some example embodiments of the inventive concepts.

FIG. 8 is a diagram illustrating a program bias condition according to some example embodiments of the inventive concepts. In FIG. 8, for the sake of convenience and brevity, among the cell strings NS11 to NS33 of the first memory block BLK1 (e.g., see FIG. 4), the cell strings NS11 and NS21 connected to the first bit line BL1 and the cell strings NS12 and NS22 connected to the second bit line BL2 are shown, but the example embodiments are not limited thereto.

Referring to FIG. 8, the first bit line BL1 is a program allowable bit line to which a relatively low program allowable voltage VPER (e.g., see FIG. 9), for example, a ground voltage VSS, is applied, and the second bit line BL2 is a program prohibit bit line to which a relatively high program prohibit voltage VINH (e.g., see FIG. 9), for example, a power supply voltage VDD, is applied, but the example embodiments are not limited thereto.

Assuming that the NS21 cell string is selected from among the cell strings NS11 and NS21 connected to the first bit line BL1, during the program operation PROGRAM (e.g., see FIG. 9), a turn-off voltage of the ground voltage VSS level is applied to the first string select line SSL1 connected to the NS11 cell string, and a turn-on voltage greater than or equal to the threshold voltage Vth of each string select transistor SST, for example, a power supply voltage VDD, may be applied to the second string select line SSL2 connected to the NS21 cell string, etc.

A turn-off voltage of the ground voltage VSS level is applied to, for example, the first and second ground select lines GSL1 and GSL2. A third precharge voltage VPC (e.g., see FIG. 9) higher than the ground voltage VSS may be applied to the source line CSL, but is not limited thereto. A program voltage VPGM (e.g., see FIG. 9) (e.g., about 18 V) is applied to the selected word line (e.g., WL3), and the pass voltage VPASS1 (e.g., see FIG. 9) (e.g., about 8 V) is applied to the unselected word lines (e.g., WL2 and WL4), but the example embodiments are not limited thereto.

Under this program bias condition, about 18 V is applied to the gate of the memory cell A and the channel voltage is about 0 V, but are not limited thereto. Because a strong electric field is formed between the gate and the channel of the memory cell A, the memory cell A is programmed. On the other hand, because the channel voltage of the memory cell B is the power supply voltage VDD and a weak electric field is formed between the gate and the channel of the memory cell B, the memory cell B is not programmed Since the channels of the memory cells C and D are in a floating state, the channel voltage rises to a boosting level by the pass voltage VPASS1, and the memory cells C and D are not programmed.

Figure 9:
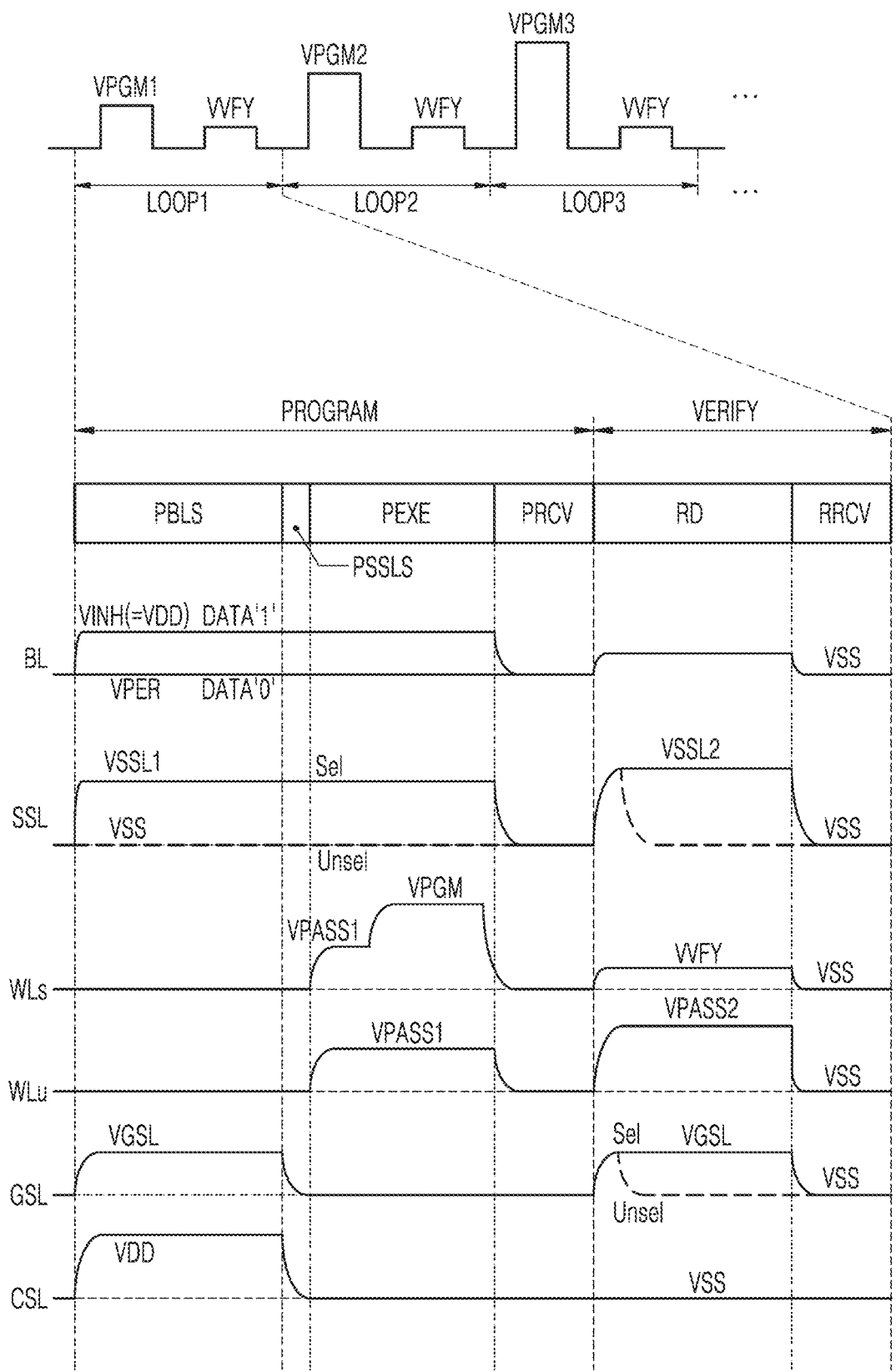

FIGS. 9 and 10 are diagrams for explaining a programming method according to some example embodiments of the inventive concepts. With respect to the memory cell A being programmed in the NS21 cell string of FIG. 8, in FIG. 9, the selected word line WLs refers to the word line WL3, the unselected word lines WLu refer to the word lines WL2 and WL4, the selected string select line SSL refers to the string select line SSL2, the unselected string select line SSL refers to the string select line SSL1, the selected ground select line GSL refers to the ground select line GSL2, the unselected ground select line GSL refers to the ground select line GSL1, the program allowable bit line BL refers to the bit line BL1, and the program prohibit bit line BL refers to the bit line BL2, which may be used interchangeable, but the example embodiments are not limited thereto.

Referring to FIG. 9, a plurality of program loops LOOP1, LOOP2, LOOP3, . . . , etc., may be sequentially performed on the memory cells connected to the selected word line WLs until the program is completed according to and/or based on the ISPP. As the program loop is repeated, the program voltages VPGM1, VPGM2, VPGM3, . . . , etc., may increase step by step (e.g., by the step voltage value, etc.). Each program loop LOOPi (wherein i is a natural number) may include a program section PROGRAM that applies the program voltage VPGM to the selected word lines WLs to program the selected memory cell, and a verification section VERIFY that applies a verification voltage VVFY to the selected word lines WLs to verify whether the program is successful, etc.

The program section PRGOGRAM may include a channel precharge and bit line setup section PBLS, a string select line setup section PSSLS, a program execution section PEXE, and/or a program recovery section PRCV, etc.

The channel precharge and bit line setup section PBLS may perform an initialization and/or precharge (hereinafter referred to as Unselect String Initial Precharge (USIP)) operation on channels of a plurality of cell strings before a program loop using the Gate Induced Drain Leakage (GIDL) phenomenon, but is not limited thereto. In the channel precharge and bit line setup section PBLS, a power supply voltage VDD that is a program prohibit voltage VINH may be applied to the program prohibit bit line BL, and a ground voltage VSS that is a program allowable voltage level may be applied to the program allowable bit line BL. A first turn-on voltage VSSL1 is applied to the selected string select line SSL, and a turn-off voltage, that is, a ground voltage VSS, may be applied to the unselected string select line SSL. A turn-on voltage VGSL may be applied to the ground select lines GSL, and a power supply voltage VDD may be applied as a precharge voltage to the source line CSL. The channels of the plurality of cell strings may be initialized according to and/or based on the GIDL phenomenon induced through the selected string select transistor SST connected to the selected string select line SSL, and may be initialized according to the GIDL phenomenon induced through the ground select transistor GST connected to the ground select lines GSL, etc.

The string select line setup section PSSLS may maintain the first turn-on voltage VSSL1 in the selected string select line SSL, apply a turn-off voltage to the unselected string select lines SSL, and/or apply a ground voltage VSS to the source line CSL and the ground select lines GSL, etc. The program execution section PEXE may apply the program pass voltage to the selected word lines WLs and the unselected word lines WLu, and apply the program voltage VPGM to the selected word lines WLs after a desired and/or preset time elapses. The program recovery section PRCV may recover the bit lines BL, the string select lines SSL, the selected word line WLs, and/or the unselected word line WLu to the ground voltage VSS, etc.

The verification section VERIFY may include a verification read section RD and a read recovery section RRCV, but is not limited thereto. The verify read section RD may apply a read pass voltage VPASS2 that enables the memory cell to always be turned on regardless of the program state of the memory cell to the unselected word line WLu, apply a verification voltage VVFY to the selected word line WLs, apply a turn-on voltage NGSL to the selected ground select line GSL, and/or apply a turn-off voltage, that is, a ground voltage VSS, to the unselected ground select line GSL, etc. The read recovery section RRCV may recover the bit lines BL, the string select lines SSL, the selected word line WLs, and/or the unselected word line WLu to the ground voltage VSS, etc.

As a result of the program operation on the memory cells connected to the word line WL3 connected to the selected string line SSL2 performed by the program methods, for example, described with reference to FIGS. 5A to 9, the pass loop information of the program states P1 to P7 may be obtained as shown in FIG. 10, but the example embodiments are not limited thereto. Illustratively, in order to explain a program method in which program verification is partially skipped for program loops for memory cells connected to the word line WL3 connected to the selected string line SSL3 of FIG. 4, the programmed word line WL3 of the SSL2 string select line is called a previous page, and the word line WL3 to be programmed of the string select line SSL3 is called a next page.

Referring to FIG. 10, after the control circuit 124 performs 10 total program loops to acquire, program, and/or set the previous page to the program state P1 in the programming operation of the previous page, the control circuit 124 may perform a program pass (e.g., a program pass operation, etc.), but is not limited thereto. For example, the program state P2 would have been program-passed after executing 12 program loops, the program state P3 would have been program-passed after executing 13 program loops, the program state P4 would have been program-passed after executing 15 program loops, the program state P5 would have been program-passed after executing 16 program loops, the program state P6 would have been program-passed after executing 18 program loops, and/or the program state P7 would have been program-passed after executing 20 program loops, etc., but the example embodiments are not limited thereto. The control circuit 124 may store a pass loop of each of the program states P1 to P7 in the register 128 of the control circuit 124, etc. The control circuit 124 may determine the number of pass loops of each of the program states P1 to P7 of the previous page stored in the register 128 as the end loop of the verification operation that determines whether each of the program states P1 to P7 of the next page is programmed, etc.

The verify offset calculator 129 of the control circuit 124 may then calculate that the threshold voltage distribution P2 in the program operation of the next page has 7 verify offsets (e.g., the verify offset number/value is 7, etc.). The verify offset calculator 129 may calculate that each of the threshold voltage distributions P3 and P4 has a verify offset of 7 times, and each of the threshold voltage distributions P5 to P7 has a verify offset of 6 times, etc.

The control circuit 124 may skip program verification with respect to the beginning of the program loops corresponding to the value obtained by subtracting the verify offset calculated by the verify offset calculator 129 from the number of pass loops of each of the program states, e.g., P1 to P7, etc., of the previous page stored in the register 128. Illustratively, in the case of the program state P2, program verification may be skipped in 5 program loops LOOP1, LOOP2, . . . , LOOP5, (e.g., 5 is a value obtained by subtracting 7 (e.g., the verify offset) from 12 (e.g., the total number of pass loops of the previous page)) from the program loop LOOP1 that starts, but the example embodiments are not limited thereto. Accordingly, the program verification may be performed in the 6th, 7th, 8th, 9th, 10th, 11th, and 12th program loops LOOP6, LOOP7, LOOP8, LOOP9, LOOP10, LOOP11, and LOOP12, etc. In other words, as shown in FIG. 10, the control circuit 124 may perform 12 total program loops on a previous page to program the previous page to the P2 program state, where X=the total number of program loops performed on the previous page, which is 12 in this case. The control circuit 124 may then perform the verification operation of the next page by not verifying the next page during the verification sections of the first M program loops performed on the next page, where M=X−the verify offset number. So in this case, M=12−7=5 program loops where the verification operation is not performed during the verification section of the program loop. The control circuit 124 may then start verifying (e.g., performing the verification operation of) the next page during the verification sections of the M+1th program loops performed on the next page, etc.

Illustratively, in the case of the program state P3, program verification may be skipped in 6 program loops LOOP1, LOOP2, LOOP6, (e.g., 6 is a value obtained by subtracting 7 (e.g., the verify offset) from 13 (e.g., the number of pass loops of the previous page)) from the program loop LOOP1 that starts. Accordingly, program verification may be performed in the 7th, 8th, 9th, 10th, 11th, 12th, and 13th program loops LOOP7, LOOP8, LOOP9, LOOP10, LOOP11, LOOP12, and LOOP13, etc. Likewise, in the case of the program state P7, program verification may be skipped in 14 program loops LOOP1, LOOP2, LOOP14, (e.g., 14 is a value obtained by subtracting 6 (e.g., the verify offset) from 20 (e.g., the number of pass loops of the previous page)) from the program loop LOOP1 that starts. Accordingly, the program verification may be performed in the 15th, 16th, 17th, 18th, 19th, and 20th program loops LOOP15, LOOP16, LOOP17, LOOP18, LOOP19, and LOOP20, etc.

Figure 11:
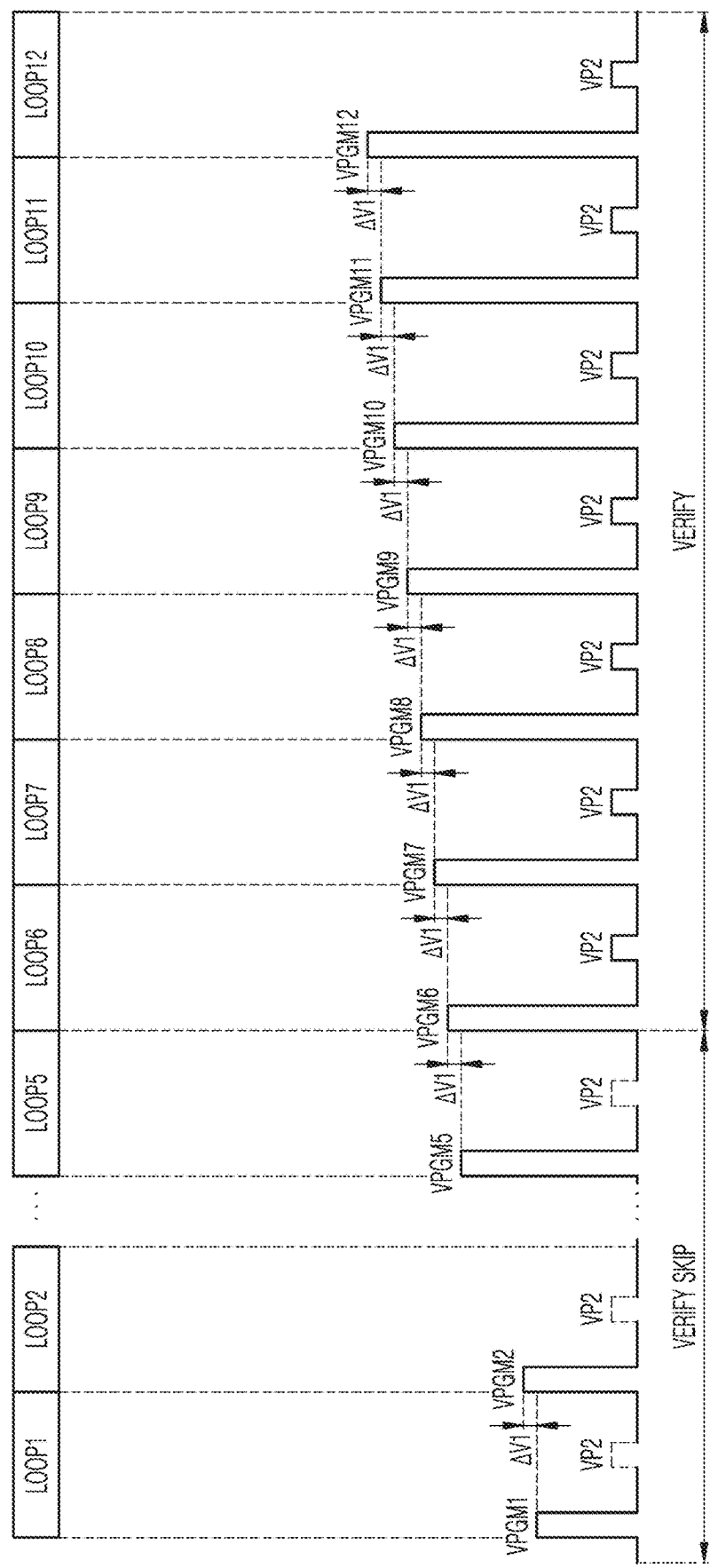
FIGS. 11 and 12 are diagrams for explaining a program method in which program verification is partially skipped for at least some of a plurality of program loops according to some example embodiments of the inventive concepts.
Figure 12:
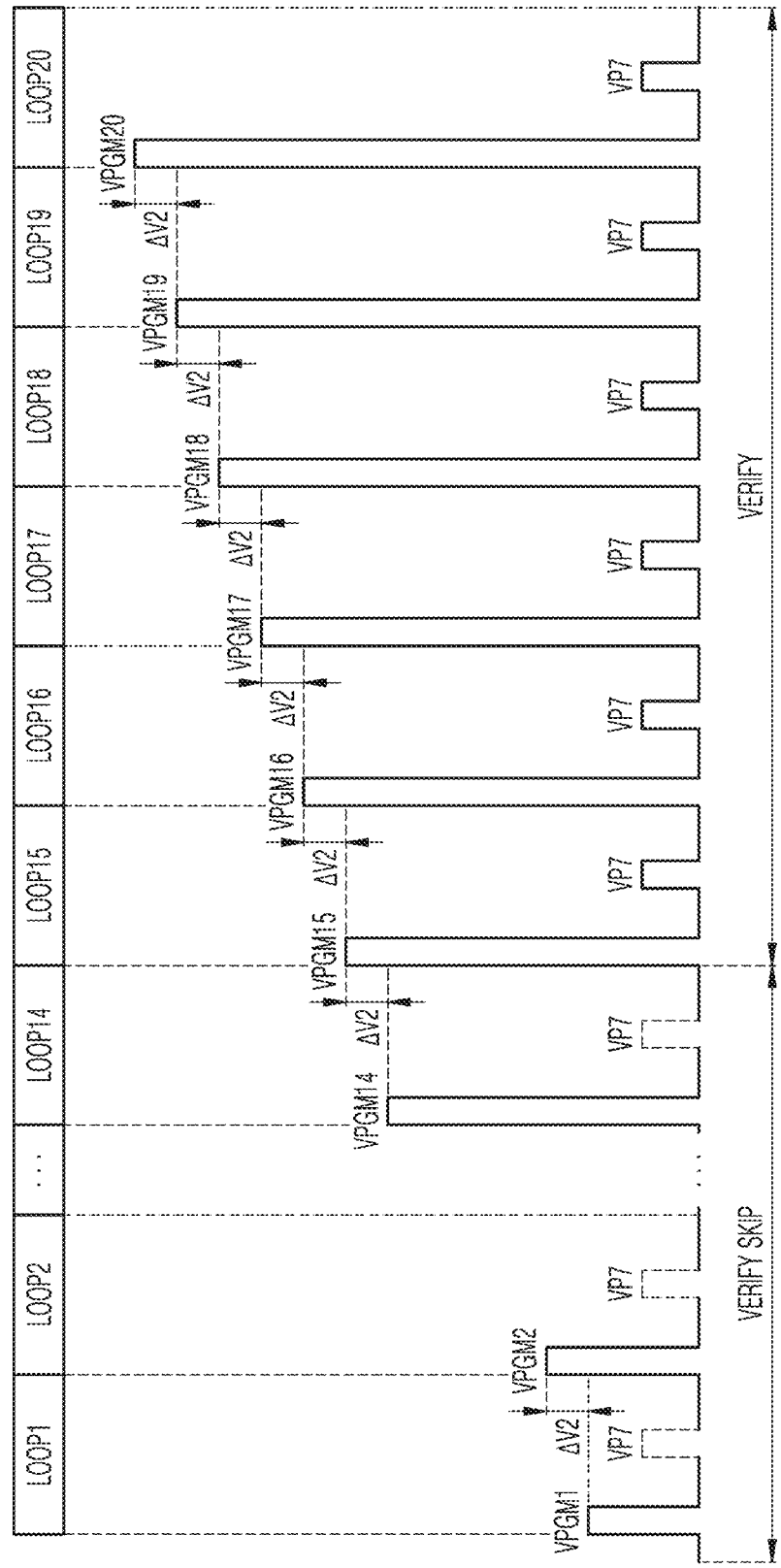

FIGS. 11 and 12 are diagrams for explaining a program method in which program verification is partially skipped for at least some of a plurality of program loops according to some example embodiments of the inventive concepts.

Referring to FIGS. 10 and 11, according to at least one example embodiment, a method of programming the next page to the target program state P2 is shown, but the example embodiments are not limited thereto. For example, in programming to the target program state P2, the 12-pass loop information of the previous page may be applied as an end point of a program operation and/or an end program loop, but the example embodiments are not limited thereto. Then, as the first voltage increment ΔV1 is applied to each program loop according to the ISPP program scheme, the desired and/or minimum number of verifications may be calculated by the control circuit 124 (and/or the verify offset calculator 129) by dividing the shift amount of the threshold voltage distribution P2 by the first voltage increment ΔV1, and therefore 7 verify offsets may be determined and/or calculated, etc.

Program verification may be skipped in 5 program loops LOOP1, LOOP2, LOOP5 (e.g., 5 is a value obtained by subtracting 7 (e.g., the verify offset) from 12 (e.g., the total number of program loops applied to program to the target program state P2) from the program loop LOOP1 that starts, etc. Program verification for the target program state P2 may be performed in 7 program loops corresponding to the number of verify offsets, that is, the 6th, 7th, 8th, 9th, 10th, 11th, and 12th program loops LOOP6, LOOP7, LOOP8, LOOP9, LOOP10, LOOP11, and LOOP12 among 12 end program loops, etc. In the 7 program loops LOOP6, LOOP7, LOOP8, LOOP9, LOOP10, LOOP11, and LOOP12, a verification voltage VP2 for verifying whether a program is successful with respect to the target program state P2 may be applied, but the example embodiments are not limited thereto.

Referring to FIGS. 10 and 12, a method of programming the next page to the target program state P7 is shown, but the example embodiments are not limited thereto. For example, in programming to the target program state P7, the 20-pass loop information of the previous page may be applied as an end point and/or an end program loop of a program operation, etc. Then, as the second voltage increment ΔV2 is applied to each program loop according to the ISPP program scheme, the desired and/or minimum number of verifications calculated by dividing the shift amount of the threshold voltage distribution P7 by the second voltage increment ΔV2, e.g., verify offset 6 may be applied, etc.

Program verification may be skipped in 14 program loops LOOP1, LOOP2, LOOP14, (e.g., 14 is a value obtained by subtracting 6 (e.g., the verify offset) from 20 (e.g., the number of end program loops applied to program to the target program state P7)) from the program loop LOOP1 that starts, etc. Program verification for the target program state P7 may be performed in 6 program loops corresponding to the number of verify offsets, that is, the 15th, 16th, 17th, 18th, 19th, and 20th program loops LOOP15, LOOP16, LOOP17, LOOP18, LOOP19, and LOOP20, among 20 end program loops, but the example embodiments are not limited thereto. In the 6 program loops LOOP15, LOOP16, LOOP17, LOOP18, LOOP19, and LOOP20, a verification voltage VP7 for verifying whether the program is successful with respect to the target program state P7 may be applied, etc.

Figure 13:
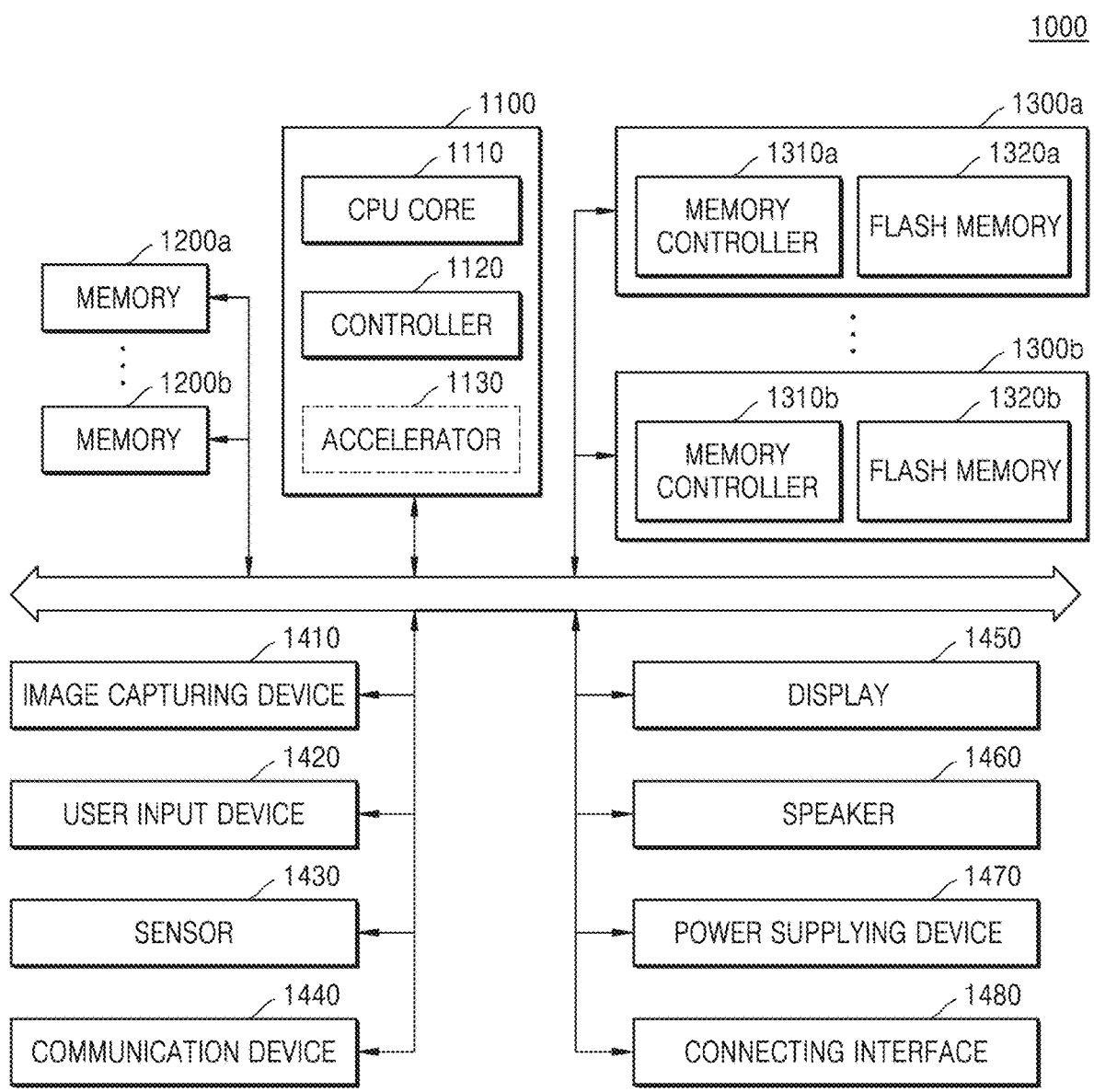
FIG. 13 is a diagram illustrating a system to which a memory system according to some example embodiments of the inventive concepts is applied.

FIG. 13 is a diagram illustrating a system to which a memory system according to at least one example embodiment of the inventive concepts is applied. A system 1000 of FIG. 13 may be a mobile system, such as a mobile phone, a smart phone, a tablet personal computer, a laptop computer, a wearable device, a healthcare device, a virtual reality device and/or an augmented reality device, and/or an Internet of things (IOT) device, etc., but is not limited thereto. Moreover, the system 1000 FIG. 13 is not limited to a mobile system, and may be a personal computer, a server, a media player, and/or an automotive device such as a navigation device, an automated vehicle, a drone, etc.

Referring to FIG. 13, the system 1000 may include at least one main processor 1100, memories 1200a and 1200b, and/or storage devices 1300a and 1300b, etc., and may further include one or more of an image capturing device 1410, user input device 1420, a sensor 1430, a communication device 1440, a display 1450, a speaker 1460, a power supplying device 1470 and/or a connecting interface 1480, etc., but the example embodiments are not limited thereto, and for example, the system 1000 may include a greater or lesser number of constituent components.

The at least one main processor 1100 may control the overall operation of the system 1000, and more particularly, the operation of other components constituting the system 1000. The at least one main processor 1100 may be implemented as a general-purpose processor, a dedicated processor, and/or an application processor, but is not limited thereto.

The at least one main processor 1100 may include one or more CPU cores 1110 and may further include a controller 1120 for controlling the memories 1200a and 1200b and/or the storage devices 1300a and 1300b. According to at least one example embodiment, the main processor 1100 may further include an accelerator 1130 that is a dedicated circuit for high-speed data operation such as artificial intelligence (AI) data operation, etc., but is not limited thereto. Such an accelerator 1130 may include a graphics processing unit (GPU), a neural processing unit (NPU), and/or a data processing unit (DPU), and the like, and may be implemented as a separate chip physically independent from other components of the main processor 1100, etc.

The memories 1200a and 1200b may be used as the main memory device of the system 1000 and may include volatile memories, such as SRAM and/or DRAM, but include non-volatile memories such as flash memory, PRAM and/or RRAM. The memories 1200a and 1200b may be implemented in the same package as the main processor 1100, but are not limited thereto.

The storage devices 1300a and 1300b may function as non-volatile storage devices that store data regardless of whether power is supplied or not, and may have a relatively large storage capacity compared to the memories 1200a and 1200b. The storage devices 1300a and 1300b may include memory controllers 1310a and 1310b and non-volatile memory (NVM) devices 1320a and 1320b that store data under the control of the memory controllers 1310a and 1310b, but are not limited thereto. The NVM devices 1320a and 1320b may include a V-NAND flash memory having a 2-dimensional (2D) structure or a 3-dimensional (3D) structure, but may include other types of non-volatile memory, such as PRAM and/or RRAM, etc.

The storage devices 1300a and 1300b may be included in the system 1000 in a state physically separated from the main processor 1100, and/or may be implemented in the same package as the main processor 1100, etc. In addition, the storage devices 1300a and 1300b have the same shape as a memory card, and thus, may be detachably coupled with other components of the system 1000 through an interface, such as the connecting interface 1480 to be described later, etc. Such storage devices 1300a and 1300b may be devices to which a standard protocol, such as universal flash storage (UFS) is applied, but is not necessarily limited thereto.

The storage devices 1300a and 1300b may include the memory system 100 described with reference to FIGS. 1 to 12, but are not limited thereto. The memory controllers 1310a and 1310b may correspond to the memory controller 110, and the NVM devices 1320a and 1320b may correspond to the memory device 120, but the example embodiments are not limited thereto. The NVM devices 1320a and 1320b include a control circuit for controlling operation modes of the NVM devices 1320a and 1320b, and the control circuit may control a program operation so that threshold voltages of memory cells of a next page to be programmed have a plurality of target states using a programmed previous page arranged adjacent to the same height from the substrate in the 3D memory cell array, but the example embodiments are not limited thereto. The control circuit may store, for example, the number of program loops of a first target state associated with the memory cells of the previous page which have been programmed to the first target state, and calculate the verify offset of the next page based on a shift amount of the threshold voltage distribution corresponding to the first target state of the next page and a voltage increment amount of the program voltage to be applied in the program loops, but is not limited thereto. When programming the memory cells of the next page to the first target state, the control circuit may determine a start loop (e.g., a first loop) and an end loop (e.g., a last loop) of the verification operation from among the plurality of program loops based on a number of program loops of the first target state of the previous page and the amount of voltage increase of the program voltage of the next page, etc. In other words, the number of program loops wherein the verification sections are skipped are based on the total number of program loops used to program the previous page to the first target state and the amount of voltage increase in the program voltage of the next page, etc.

The at least one image capturing device 1410 may capture a still image and/or a moving image, and may be a camera, a camcorder, and/or a webcam, etc.

The at least one user input device 1420 may receive various types of data input from a user of the system 1000, and may be a touch pad, a keypad, a keyboard, a mouse, and/or a microphone, etc.

The at least one sensor 1430 may detect various types of physical quantities that may be obtained from the outside of the system 1000, and may convert the sensed physical quantities into electrical signals, etc. Such a sensor 1430 may be a temperature sensor, a pressure sensor, an illuminance sensor, a position sensor, an acceleration sensor, a biosensor and/or a gyroscope sensor, etc., but is not limited thereto.

The communication device 1440 may transmit and/or receive signals between other devices outside the system 1000 (e.g., external sources, etc.) according to various communication protocols. Such a communication device 1440 may be implemented including an antenna, a transceiver, and/or a modem, etc.

The display 1450 and the speaker 1460 may function as output devices that respectively output visual information and audio information to the user of the system 1000.

The power supplying device 1470 may appropriately convert power supplied from a battery (not shown) built into and/or connected to the system 1000 and/or an external power source and supply the converted power to each component of the system 1000, etc.

The connecting interface 1480 may provide a connection between the system 1000 and at least one external device connected to the system 1000 to exchange data with the system 1000. The connecting interface 1480 may be implemented in various interface methods, such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), and/or compact flash (CF) card interfaces, etc., or any combinations thereof.

While various example embodiments of the inventive concepts have been particularly shown and described with reference to examples thereof, it will be understood that various changes in form and details may be made therein without departing from the spirit and scope of the following claims.

What is claimed is:

1. A method of programming a memory device, the method comprising:
applying program loops to a plurality of memory cells of the memory device to adjust threshold voltages of the plurality of memory cells to desired target states, each of the program loops including a program section and a verification section, the program section being a first time period during which a program voltage is applied to the memory cells, and the verification section being a second time period during which a verification voltage is applied to the memory cells, the program loops including first program loops performed on a first page and second program loops performed on a second page;

programming the memory cells of the first page to a first target state during the program sections of the first program loops;

storing a number of the first program loops used to complete the programming of the memory cells of the first page to the first target state;

programming the memory cells of the second page to the first target state during the program sections of the second program loops, the second page adjacent to the first page;

calculating a verify offset number associated with the second page, the calculating the verify offset number including dividing a shift amount of a first threshold voltage distribution corresponding to the first target state of the second page by a voltage increment of the program voltage to be applied in the second program loops performed on the second page, the calculated verify offset number corresponding to a total number of the second program loops where the verification operation is to be performed; and performing a verification operation on the second page during at least one of the verification sections of the second program loops performed on the second page, the performing the verification operation including determining whether the memory cells of the second page are programmed to the first target state, the performing the verification operation on the second page based on the stored number of the first program loops and the verify offset number.

2. The method of claim 1, wherein the performing the verification operation on the second page includes:
skipping the verification operation during verification sections of a first M program loops of the second program loops performed on the second page, where M equals the stored number of the first program loops minus the verify offset number.

3. The method of claim 2, wherein the performing the verification operation on the second page includes:
performing the verification operation during verification sections of the M+1th program loop of the second program loops to a Nth program loop of the second program loops, where N equals the stored number of first program loops.

4. The method of claim 1, further comprising:
programming the memory cells of a third page adjacent to the first page of the memory device to the first target state during program sections of third program loops of the program loops;
storing a number of the third program loops used to complete the programming of the memory cells of the third page to the first target state;
programming the memory cells of a fourth page of the memory device to the first target state during program sections of fourth program loops of the program loops, the fourth page adjacent to the third page; and
performing a second verification operation on the fourth page during at least one second verification section of the fourth program loops, the performing the second verification operation based on the stored number of the third program loops.

5. The method of claim 4, wherein a total number of verification operations performed on the second page are different than a total number of verification operations performed on the fourth page.

6. The method of claim 1, wherein
the programming of the memory cells of the first page and the second page comprises programming first to third data to the first page and the second page, each of the first to third data including 3 bits of data; and
the method further comprising,
programming first memory cells of the first page and the second page having a second threshold voltage distribution corresponding to an erase state to store the first data using a first step program, the programming the first memory cells to store the first data including programming the first memory cells to have a threshold voltages corresponding to a third threshold voltage distributions of a first program state,
programming second memory cells of the first page and the second page having the second threshold voltage distribution corresponding to the erase state to store the second and the third data using a second step program, the programming the second memory cells to store the second and the third data including programming the second memory cells to have threshold voltages corresponding to fourth to sixth threshold voltage distributions corresponding to second to fourth program states, respectively, and
programming the first memory cells of the first page and the second page having the third threshold voltage distribution corresponding to the first program state to store the second and the third data using the second step program, the programming the first memory cells to store the second and the third data including programming the first memory cells to have threshold voltages corresponding to seventh to tenth threshold voltage distributions corresponding to fifth to eighth program states, respectively.

7. A method of programming a memory device, the method comprising:
programming a plurality of memory cells of a memory cell array to desired target states using program loops, each of the program loops including a program section and a verification section, the program section being a first time period during which a program voltage is applied to the memory cells, and the verification section being a second time period during which a verification voltage is applied to the memory cells, the program loops including first program loops performed on a first page of the memory cell array and second program loops performed on a second page of the memory cell array;
programming the memory cells of the first page to a first target state;
storing a number of the first program loops used to complete the programming of the memory cells of the first page to the first target state;
programming the memory cells of the second page to the first target state during the program sections of the second program loops, the second page adjacent to the first page;
calculating a verify offset number associated with the second page, the calculating the verify offset number including dividing a shift amount of a first threshold voltage distribution corresponding to the first target state of the second page by a voltage increment of the program voltage to be applied in the second program loops performed on the second page, the calculated verify offset number corresponding to a total number of the second program loops where the verification operation is to be performed; and performing a verification operation on the second page during at least one of the verification sections of the second program loops performed on the second page, the performing the verification operation including determining whether the memory cells of the second page are programmed to the first target state, the performing the verification operation on the second page based on a relationship between the stored number of the first program loops and the verify offset number.

8. The method of claim 7, wherein an end loop of the verification operation of the second page corresponds to a total number of the first program loops.

9. The method of claim 7, wherein the performing the verification operation on the second page includes:
skipping the verification operation during verification sections of a first M program loops of the second program loops performed on the second page, where M equals the stored number of the first program loops minus the verify offset number.

10. The method of claim 7, wherein the performing the verification operation on the second page includes:
performing the verification operation on the second page during the verification sections of the M+1th program loop of the second program loops performed on the second page to a Nth program loop of the second program loops performed on the second page, where N equals the stored number of first program loops.

11. The method of claim 7, wherein
the programming of the memory cells of the first page and the second page comprises programming first to third data to the first page and the second page, each of the first to third data each including 3 bits of data; and
the method further comprises,
programming first memory cells of the first page and the second page having a first threshold voltage distribution corresponding to an erase state to store the first data using a first step program, the programming the first memory cells to store the first data including programming the first memory cells to have a threshold voltage corresponding to a second threshold voltage distributions corresponding to a first program state,
programming second memory cells of the first page and the second page having the first threshold voltage distribution corresponding to the erase state to store the second and the third data using a second step program, the programming the second memory cells to store the second and the third data including programming the second memory cells to have threshold voltages corresponding to third to fifth threshold voltage distributions corresponding to second to fourth program states, respectively, and
programming the first memory cells of the first page and the second page having the second threshold voltage distribution corresponding to the first program state to store the second and the third data using the second step program, the programming the first memory cells to store the second and the third data including programming the first memory cells to have threshold voltages corresponding to sixth to ninth threshold voltage distributions corresponding to fifth to eighth program states, respectively.

12. A memory device comprising:
a memory cell array including a plurality of memory cells programmed with 3 bits of data per memory cell, the memory cell array including a first page and a second page; and
a control circuit configured to control a program operation of the memory cell array so that threshold voltages of the memory cells of the first page and the second page have target states, the second page arranged adjacent to the first page,
the program operation including performing a plurality of program loops on the memory cell array based on a voltage increment of a program voltage, the plurality of program loops including first program loops performed on the first page and second program loops performed on the second page, and
each of the program loops comprises a program section and a verification section, the program section being a first time period in which the program voltage is applied to the memory cells, and the verification section being a second time period to apply a verification voltage to the memory cells, and
the control circuit is further configured to,
store a number of the first program loops of the program loops used to complete the programming of the memory cells of the first page to a first target state,
calculate a verify offset number associated with the second page based on a shift amount of a first threshold voltage distribution corresponding to the first target state of the second page and the voltage increment of the program voltage, the calculated verify offset number corresponding to a number of the second program loops performed on the second page where a verification operation is to be performed, and
determine which verification sections of the second program loops of the plurality of program loops to skip based on the stored number of first program loops and the voltage increment of the program voltage when programming the memory cells of the second page to the first target state.

13. The memory device of claim 12, wherein the control circuit is further configured to:
program first to third data to the first and second pages, each of the first to third data including 3 bits of data,
the programming the first to third data to the first and second pages including programming first memory cells of the first page and the second page having a second threshold voltage distribution corresponding to an erase state to store the first data using a first step program, the programming the first memory cells to store the first data including programming the first memory cells corresponding to a first program state,
programming second memory cells of the first page and the second page having the second threshold voltage distribution corresponding to the erase state to store the second and the third data using a second step program, the programming the second memory cells including programming the second memory cells to have threshold voltages corresponding to third to fifth threshold voltage distributions corresponding to second to fourth program states, respectively, and
programming the first memory cells of the first page and the second page having a sixth threshold voltage distribution corresponding to the first program state to store the second and the third data using the second step program, the programming the first memory cells to store the second and the third data including programming the first memory cells to have threshold voltages corresponding to seventh to tenth threshold voltage distributions corresponding to fifth to eighth program states, respectively.

14. The memory device of claim 12, wherein the control circuit is further configured to:

perform a verification operation on the second page during at least one of the verification sections of the second program loops performed on the second page, the performing the verification operation based on the stored number of first program loops and the verify offset number.

15. The memory device of claim 12, wherein the control circuit is further configured to:

skip a verification operation during the verification sections of a first M program loops of the second program loops performed on the second page, where M equals the stored number of the first program loops minus the verify offset number.

16. The memory device of claim 12, wherein the control circuit is further configured to:

perform a verification operation of the first target state of the second page by skipping the verification sections of the second program loops until the verify offset number is reached.

17. The memory device of claim 12, wherein the memory device comprises:

a first chip on which a peripheral circuit area including the control circuit is formed, wherein the peripheral circuit area is arranged on a first surface of a first substrate of the first chip; and a second chip on which the memory cell arrays are formed, wherein the memory cell arrays are arranged on a first surface of a second substrate of the second chip, and the second chip is vertically stacked on the first chip so that the first surface of the first substrate and the first surface of the second substrate are bonded.

* * * * *